(12) United States Patent
Sung et al.

(10) Patent No.: US 11,362,305 B2
(45) Date of Patent: *Jun. 14, 2022

(54) DISPLAY DEVICE AND METHOD OF MANUFACTURING THE SAME

(71) Applicant: SAMSUNG DISPLAY CO., LTD., Yongin-si (KR)

(72) Inventors: Taehyun Sung, Seoul (KR); Kwan-su Kim, Cheonan-si (KR); Junghoon Han, Uiwang-si (KR); Kyoungil Min, Hwaseong-si (KR); Hyungu Lee, Asan-si (KR); Junshik Park, Incheon (KR)

(73) Assignee: Samsung Display Co., Ltd., Yongin-si (KR)

( * ) Notice: Subject to any disclaimer, the term of this patent is extended or adjusted under 35 U.S.C. 154(b) by 28 days.

This patent is subject to a terminal disclaimer.

(21) Appl. No.: 16/944,461

(22) Filed: Jul. 31, 2020

(65) Prior Publication Data

US 2020/0365829 A1     Nov. 19, 2020

Related U.S. Application Data

(60) Continuation of application No. 16/532,952, filed on Aug. 6, 2019, now Pat. No. 10,763,454, which is a
(Continued)

(30) Foreign Application Priority Data

Jun. 10, 2016   (KR) .................. 10-2016-0072735

(51) Int. Cl.
*H01L 27/32*     (2006.01)
*H01L 51/52*     (2006.01)
(Continued)

(52) U.S. Cl.
CPC ...... *H01L 51/5253* (2013.01); *H01L 27/3244* (2013.01); *H01L 27/3246* (2013.01);
(Continued)

(58) Field of Classification Search
CPC ............ H01L 27/3258; H01L 27/3246; H01L 27/3244
See application file for complete search history.

(56) References Cited

U.S. PATENT DOCUMENTS

| 9,153,636 B2 | 10/2015 | Tanaka |
| 10,345,968 B2 | 7/2019 | Kim et al. |
| 10,411,219 B2 | 9/2019 | Sung et al. |
| 2006/0278333 A1 | 12/2006 | Lee et al. |

(Continued)

FOREIGN PATENT DOCUMENTS

| EP | 2908342 A1 | 8/2015 |
| JP | 2008-107440 A | 5/2008 |

(Continued)

OTHER PUBLICATIONS

EPO Extended Search Report dated Oct. 16, 2017, for corresponding European Patent Application No. 17167640.6 (9 pages).
EPO Office Action dated Jan. 30, 2020, for corresponding European Patent Application No. 17167640.6 (5 pages).
(Continued)

*Primary Examiner* — Douglas M Menz
(74) *Attorney, Agent, or Firm* — Lewis Roca Rothgerber Christie LLP

(57) ABSTRACT

A display device and a method of manufacturing a display device are provided. A manufacturing method of a display apparatus includes forming a display module including a first area and including a display panel including lower and upper surfaces opposite each other, a first film under the lower surface of the display panel, a second film on the upper surface of the display panel, and an adhesive layer
(Continued)

between the lower surface of the display panel and the first film; weakening an adhesive force of a first adhesive portion of the adhesive layer in the first area to be weaker than an adhesive force of a second adhesive portion of the adhesive layer outside the first area; cutting the first film and the adhesive layer; and removing a portion of the first film and the first adhesive portion from the first area.

20 Claims, 19 Drawing Sheets

Related U.S. Application Data division of application No. 16/160,803, filed on Oct. 15, 2018, now Pat. No. 10,411,219, which is a division of application No. 15/409,491, filed on Jan. 18, 2017, now Pat. No. 10,141,540.

(51) Int. Cl.
  *H01L 51/00* (2006.01)
  *H01L 51/56* (2006.01)

(52) U.S. Cl.
  CPC ...... *H01L 27/3258* (2013.01); *H01L 51/0097* (2013.01); *H01L 51/56* (2013.01); *H01L 2251/5338* (2013.01); *Y02E 10/549* (2013.01); *Y02P 70/50* (2015.11)

(56) References Cited

U.S. PATENT DOCUMENTS

| | | |
|---|---|---|
| 2012/0118478 A1 | 5/2012 | Park et al. |
| 2012/0312481 A1 | 12/2012 | Kang et al. |
| 2013/0240855 A1 | 9/2013 | Chida et al. |
| 2014/0130339 A1 | 5/2014 | Shin |
| 2015/0146386 A1 | 5/2015 | Namkung et al. |
| 2015/0227172 A1 | 8/2015 | Namkung et al. |
| 2015/0263300 A1 | 9/2015 | Namkung et al. |
| 2015/0310776 A1 | 10/2015 | Lee et al. |

FOREIGN PATENT DOCUMENTS

| | | |
|---|---|---|
| JP | 2014-48619 A | 3/2014 |
| JP | 2015-121777 A | 7/2015 |
| JP | 2016-21235 A | 2/2016 |
| KR | 10-2004-0070033 A | 8/2004 |
| KR | 10-2012-0137868 A | 12/2012 |
| KR | 10-2014-0009920 A | 1/2014 |
| KR | 10-2014-0062666 A | 5/2014 |
| KR | 10-2015-0094989 A | 8/2015 |
| TW | 201432532 A | 8/2014 |
| WO | WO 2004/068203 A1 | 8/2004 |
| WO | WO 2013/131371 A | 9/2013 |
| WO | WO 2015/116465 A1 | 8/2015 |

OTHER PUBLICATIONS

Taiwan Office Action in corresponding Taiwan Patent Application No. 106119194, Taiwan Office Action dated Jan. 18, 2021 (8 pgs.).

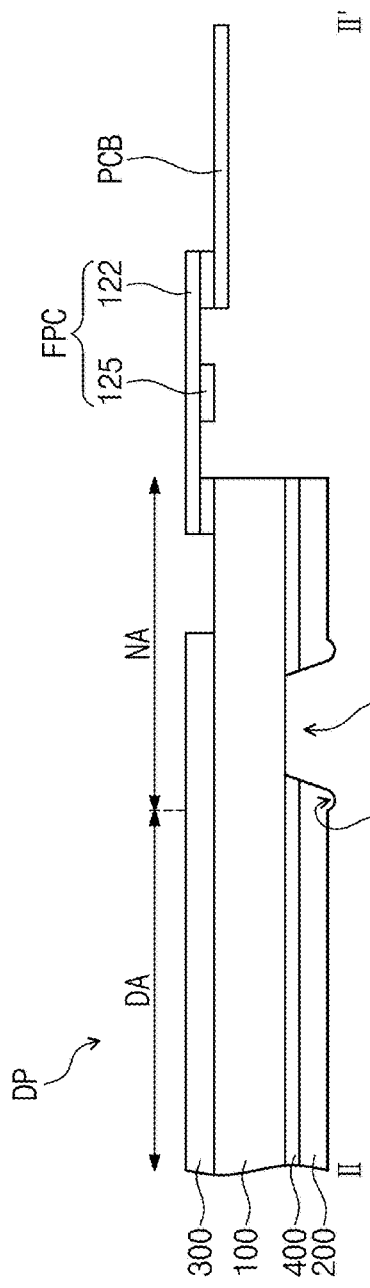
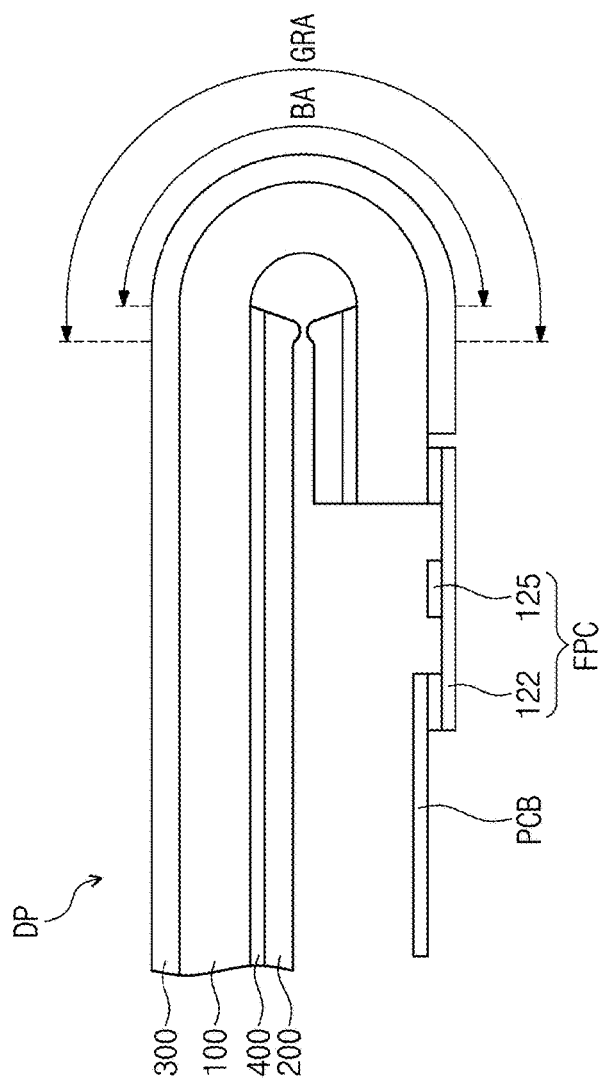
FIG. 14
FIG. 15

DISPLAY DEVICE AND METHOD OF MANUFACTURING THE SAME

CROSS-REFERENCE TO RELATED APPLICATIONS

This application is a continuation of U.S. patent application Ser. No. 16/532,952, filed Aug. 6, 2019, which is a divisional of U.S. patent application Ser. No. 16/160,803, filed Oct. 15, 2018, now U.S. Pat. No. 10,411,219, issued Sep. 10, 2019, which is a divisional of U.S. patent application Ser. No. 15/409,491, filed Jan. 18, 2017, now U.S. Pat. No. 10,141,540, issued Nov. 27, 2018, which claims priority to and the benefit of Korean Patent Application No. 10-2016-0072735, filed on Jun. 10, 2016 in the Korean Intellectual Property Office, the entire content of each of which is incorporated herein by reference.

BACKGROUND

1. Field

The present disclosure relates to a display device and a method of manufacturing the same. More particularly, the present disclosure relates to an organic light emitting display device and a method of manufacturing the organic light emitting display device.

2. Description of the Related Art

An organic light emitting display device includes a plurality of pixels. Each pixel includes an organic light emitting diode and a circuit part controlling the organic light emitting diode. The circuit part includes at least a control transistor, a driving transistor, and a storage capacitor.

The organic light emitting diode includes an anode, a cathode, and an organic light emitting layer disposed between the anode and the cathode. The organic light emitting diode emits a light when a voltage greater than a threshold voltage of the organic light emitting layer is applied between the anode and the cathode.

SUMMARY

According to an aspect, the present disclosure provides a display device including a display module easily bent in a bending area and having a small radius of curvature by providing a groove overlapped with the bending area in a first film and an adhesive layer.

According to another aspect, the present disclosure provides a method of manufacturing a display device capable of easily removing a portion of the adhesive layer and a portion of the first film in a target area after forming the adhesive layer and the first film on a display panel.

According to one or more embodiments of the inventive concept, a method of manufacturing a display device includes: forming a display module including a first area defined therein, the display module including a display panel including a lower surface and an upper surface opposite the lower surface, a first film under the lower surface of the display panel, a second film on the upper surface of the display panel, and an adhesive layer between the lower surface of the display panel and the first film; weakening an adhesive force of a first adhesive portion of the adhesive layer in the first area to be weaker than an adhesive force of a second adhesive portion of the adhesive layer outside the first area; cutting the first film and the adhesive layer along an edge of the first area; and removing a portion of the first film and the first adhesive portion from the first area.

According to an embodiment, the cutting the first film and the adhesive layer is performed after the weakening the adhesive force.

According to an embodiment, the display module includes a display area to display an image and a non-display area adjacent to the display area, and the first area is defined in the non-display area.

According to an embodiment, the weakening the adhesive force includes irradiating an ultraviolet ray to the first area along an upper direction extending from the lower surface of the display panel to the upper surface of the display panel.

According to an embodiment, the cutting the first film and the adhesive layer is performed by irradiating a laser beam along the upper direction.

According to an embodiment, the laser beam is a $CO_2$ laser beam or an UV laser beam.

According to an embodiment, the first area crosses the display module in a first direction when viewed in a plan view, and the cutting the first film and the adhesive layer includes irradiating the laser beam to a first edge of the first area extending in the first direction and irradiating the laser beam to a second edge of the first area extending in the first direction and spaced apart from the first edge of the first area.

According to an embodiment, the method further includes bending the display module with respect to a reference axis defined in the first area and extending in the first direction.

According to an embodiment, the removing the portion of the first film and the first adhesive portion is performed within one hour after the cutting the first film and the adhesive layer is performed.

According to one or more embodiments of the inventive concept, a display device includes a display panel, a first film, a second film, and an adhesive layer. The display panel includes a first area defined therein and includes a lower surface and an upper surface opposite the lower surface. The first film is under the lower surface of the display panel and includes a film groove defined therein to overlap with the first area. The second film is on the upper surface of the display panel. The adhesive layer is between the lower surface of the display panel and the first film and includes an adhesive groove defined therein to overlap with the first area.

According to an embodiment, a surface roughness of a first portion of the lower surface of the display panel in the first area is different from a surface roughness of a second portion of the lower surface of the display panel outside the first area.

According to an embodiment, the surface roughness of the first portion of the lower surface of the display panel is greater than the surface roughness of the second portion of the lower surface of the display panel.

According to an embodiment, the first portion of the lower surface of the display panel is exposed by the film groove and the adhesive groove.

According to an embodiment, an angle between the second portion of the lower surface of the display panel and each of an inner surface of the first film defining the film groove and an inner surface of the adhesive layer defining the adhesive groove is an acute angle.

According to an embodiment, the display panel includes a base substrate, a driving layer, an organic light emitting diode, and a sealing layer. The base substrate defines the lower surface and includes polyimide. The driving layer is on the base substrate. The organic light emitting diode is on the driving layer. The sealing layer covers the organic light emitting diode.

According to an embodiment, a first base substrate portion of the base substrate in the first area has a first thickness, and a second base substrate portion of the base substrate outside the first area has a second thickness greater than the first thickness.

According to an embodiment, the adhesive layer covers the first portion of the lower surface of the display panel, a first adhesive layer portion of the adhesive layer in the first area has a third thickness, and a second adhesive layer portion of the adhesive layer outside the first area has a fourth thickness greater than the third thickness.

According to an embodiment, the display device further includes carbides contacting the first portion of the lower surface of the display panel.

According to an embodiment, the display device further includes a burr on a lower surface of the first film adjacent to the film groove.

According to an embodiment, the display panel includes a display area to display an image and a non-display area adjacent to the display area, and the first area is defined in the non-display area.

According to an embodiment, the display panel includes a display area to display an image and a non-display area adjacent to the display area, and the first area is defined to cross the display area.

According to an embodiment, the first area crosses the display panel in a first direction when viewed in a plan view and is bent with respect to a reference axis defined in the first area and extending in the first direction.

According to an embodiment, the first film includes polyethylene terephthalate.

According to an embodiment, the second film includes a polarizing plate.

According to one or more embodiments of the inventive concept, a display device includes a display panel, a first film, a second film, and an adhesive layer. The display panel includes a first area defined therein and includes a lower surface and an upper surface opposite the lower surface. The first film is under the lower surface of the display panel and includes a film groove defined therein to overlap with the first area. The second film is on the upper surface of the display panel. The adhesive layer is between the lower surface of the display panel and the first film and includes an adhesive groove defined therein to overlap with the first area. The display panel includes a base substrate defining the lower surface of the display panel, a first portion of the base substrate in the first area having a first thickness, and a second portion of the base substrate outside the first area having a second thickness greater than the first thickness.

According to an embodiment, the base substrate includes polyimide.

According to an embodiment, a surface roughness of the first portion of the base substrate is greater than a surface roughness of the second portion of the base substrate.

According to an embodiment, the first area crosses the display panel in a first direction when viewed in a plan view and is bent with respect to a reference axis defined in the first area and extending in the first direction.

According to an embodiment, the display panel includes a display area to display an image and a non-display area adjacent to the display area, and the first area is defined in the non-display area.

According to an embodiment, the display device further includes a printed circuit board connected to the non-display area of the display panel, and the first area is bent with respect to the reference axis between the display area and the printed circuit board.

According to aspects of the display device, the groove is provided to the first film and the adhesive layer to overlap with the bending area, and thus the display module may be easily bent in the bending area, and the radius of curvature of the display module may become small.

According to aspects of the manufacturing method of the display device, after the adhesive layer and the first film are formed on the entire surface of the display panel, the portion of the adhesive layer and the portion of the first film, which are disposed in the target area, may be easily removed.

BRIEF DESCRIPTION OF THE DRAWINGS

The above and other aspects and advantages of the present disclosure will become readily apparent by reference to the following detailed description when considered in conjunction with the accompanying drawings wherein:

FIG. 14 is a cross-sectional view taken along a line II-II' of FIG. 13;

FIG. 15 is a cross-sectional view taken along the line II-II' of FIG. 13 when the organic light emitting display device is bent;

DETAILED DESCRIPTION

The following description with reference to the accompanying drawings is provided to assist in a comprehensive understanding of various embodiments of the present disclosure as defined by the claims and their equivalents. It includes various specific details to assist in that understanding but these are to be regarded as merely exemplary. Accordingly, those of ordinary skill in the art will recognize that various changes and modifications of the various embodiments described herein can be made without departing from the scope and spirit of the present disclosure.

It will be understood that when an element or layer is referred to as being "on," "connected to," or "coupled to" another element or layer, it can be directly on, connected, or coupled to the other element or layer, or intervening elements or layers may be present. In contrast, when an element is referred to as being "directly on," "directly connected to," or "directly coupled to" another element or layer, there are no intervening elements or layers present.

Hereinafter, some exemplary embodiments of the present invention will be explained in further detail with reference to the accompanying drawings.

Figure 1:
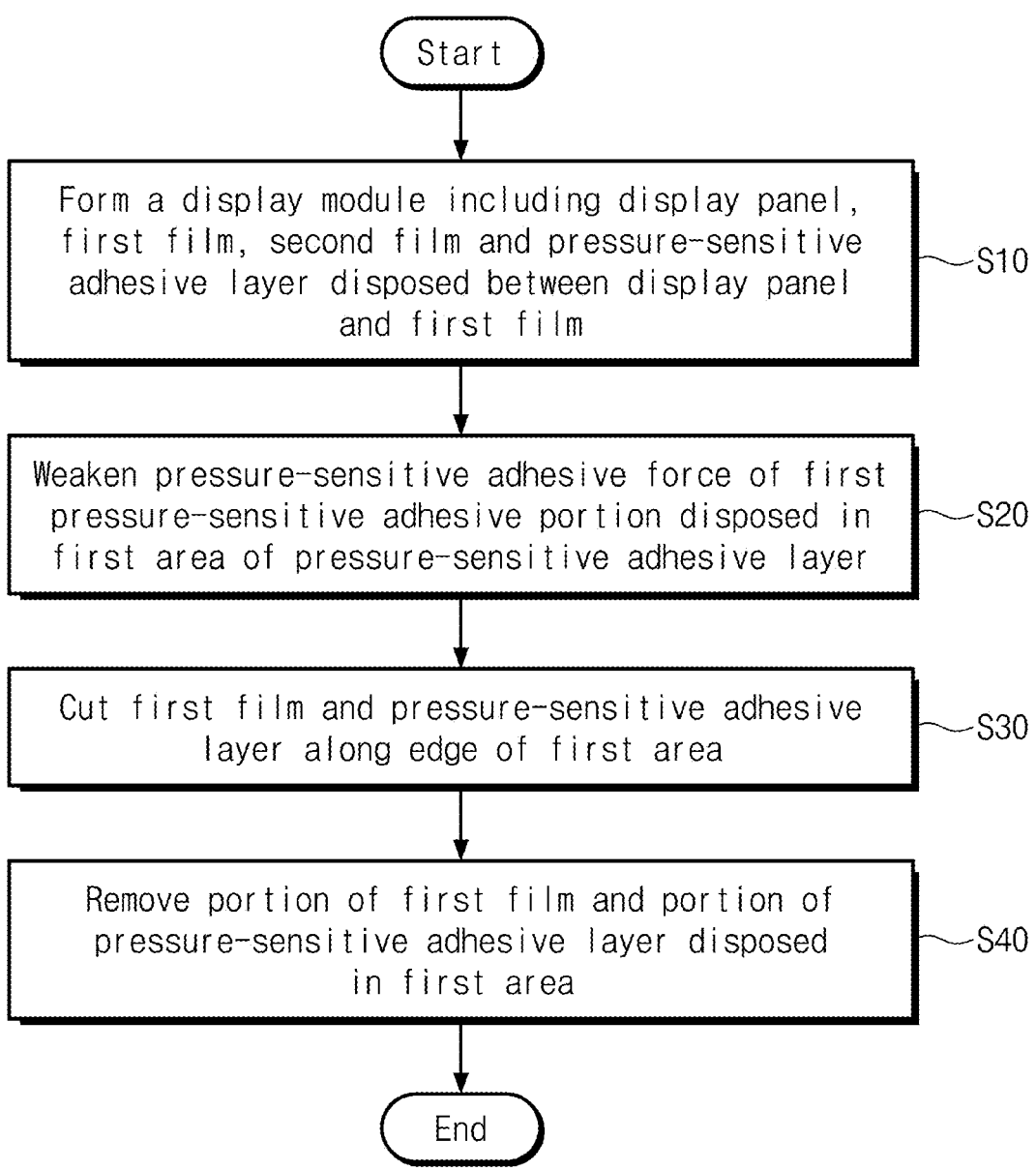
FIG. 1 is a flowchart showing a method of manufacturing a display device according to an exemplary embodiment of the present disclosure.
Figure 2:
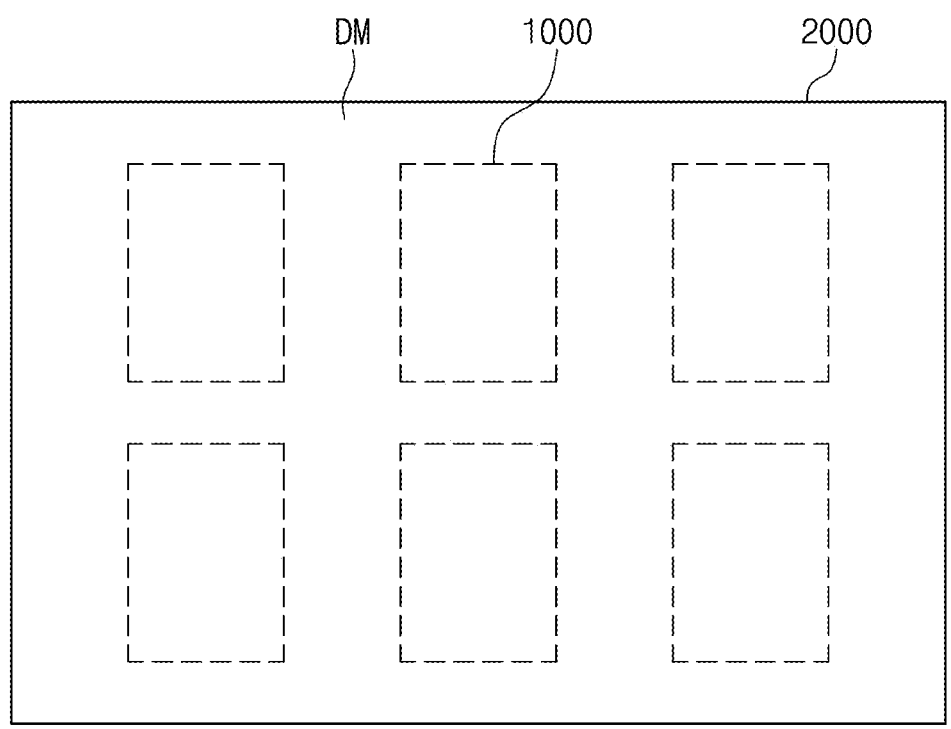
FIG. 2 is a plan view showing a mother substrate according to an exemplary embodiment of the present disclosure.
Figure 2:
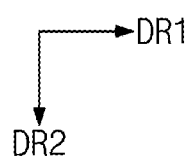
Figure 3:
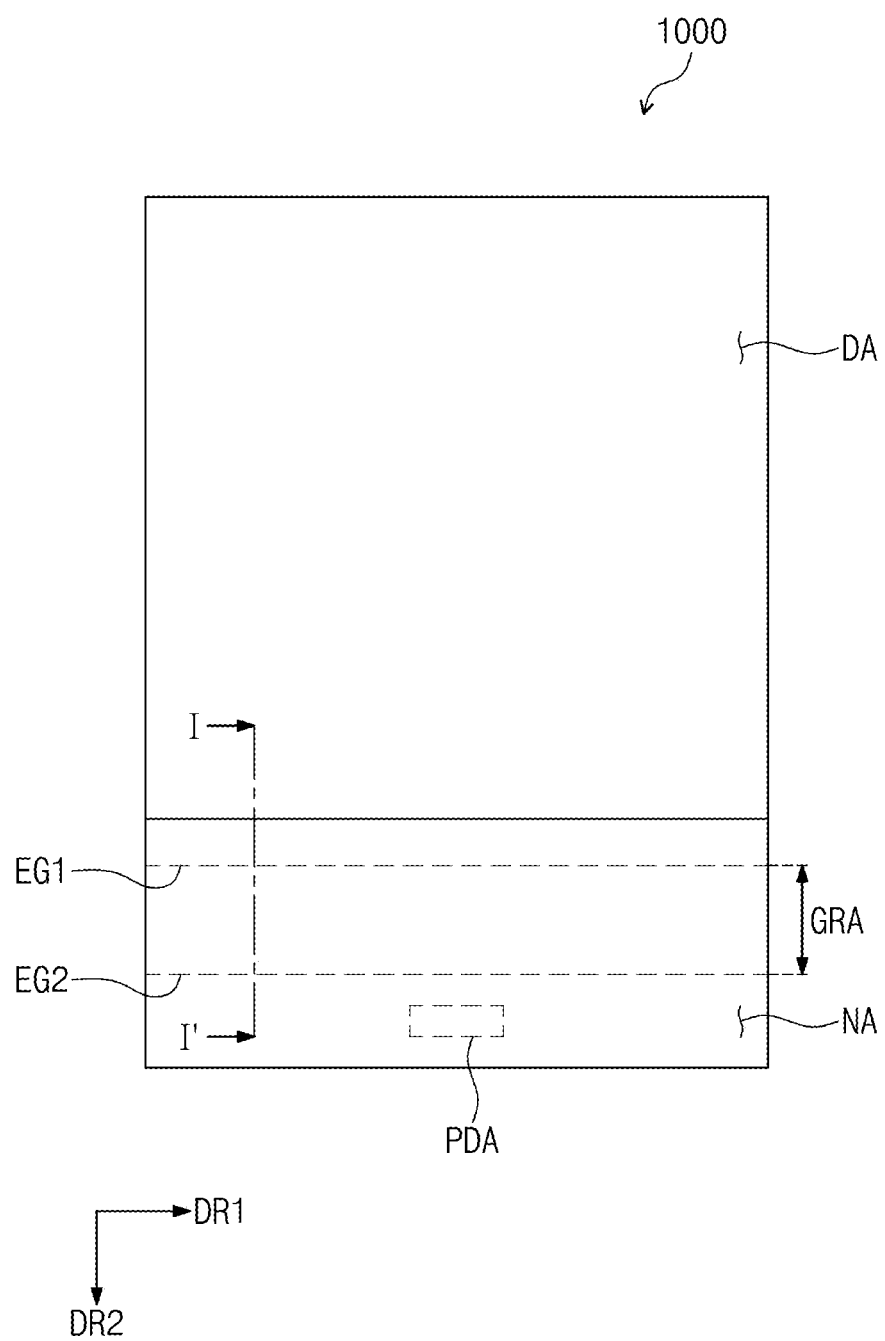
FIG. 3 is a plan view showing a display module of FIG. 2.

FIG. 1 is a flowchart showing a method of manufacturing a display device according to an exemplary embodiment of the present disclosure; FIG. 2 is a plan view showing a mother substrate according to an exemplary embodiment of the present disclosure; FIG. 3 is a plan view showing a display module of FIG. 2; and FIGS. 4 and 6 to 9 are cross-sectional views taken along a line I-I' of FIG. 3.

Referring to FIGS. 1 and 2, a mother substrate 2000 including a display module 1000 is formed (S10).

The mother substrate 2000 includes a plurality of display modules 1000 and a dummy part DM. The display modules 1000 are formed using one substrate.

In FIG. 2, the mother substrate 2000 including six display modules 1000 is shown, but the number of the display modules 1000 is not limited to six. That is, the number of the display modules 1000 included in one mother substrate 2000 may be greater than or less than six.

The display modules 1000 and the dummy part DM may be flexible. Accordingly the mother substrate 2000 may be flexible.

Each of the display modules 1000 displays an image in response to a signal applied thereto. Each of the display modules 1000 may include any of various types of display panels, but, hereinafter, the display modules 1000 including an organic light emitting display panel will be described.

The dummy part DM is disposed between the display modules 1000. The dummy part DM is disposed adjacent to an edge of each of the display modules 1000 to surround the display modules 1000. The dummy part DM may be finally removed in the manufacturing process of the display device.

Hereinafter, directions in which two adjacent sides of the display module 1000 extend are respectively referred to as a first direction DR1 and a second direction DR2. In FIG. 2, the first direction DR1 corresponds to a direction in which short sides of the display module 1000 extend, and the second direction DR2 corresponds to a direction in which long sides of the display module 1000 extend. However, the first direction DR1 and the second direction DR2 may be changed with respect to each other according to embodiments.

When viewed in a plan view, the display module 1000 includes a display area DA and a non-display area NA defined therein. The image is displayed through the display area DA and not displayed through the non-display area NA. The non-display area NA is disposed adjacent to the display area DA.

In FIG. 3, the non-display area NA is disposed adjacent to one side of the display area DA. In an embodiment, the display area DA and the non-display area NA are disposed adjacent to each other in the second direction DR2, but are not limited thereto or thereby. That is, the non-display area may be further defined adjacent to one or more of the other three sides of the display area DA.

A pad area PDA is defined in the non-display area NA. The pad area PDA is connected to a flexible printed circuit board (not shown), and the display module 1000 receives signals required to drive itself through the pad area PDA.

A first area GRA may be further defined in the non-display area NA. The first area GRA is defined between the pad area PDA and the display area DA and spaced apart from the pad area PDA and the display area DA. The first area GRA may correspond to an area in which a groove is defined when the organic light emitting display device according to the present disclosure is completely manufactured.

The first area GRA crosses the display module 1000 in the first direction DR1 when viewed in a plan view. A first edge EG1 and a second edge EG2 of the first area GRA extend in the first direction DR1 and are spaced apart from each other.

Figure 4:
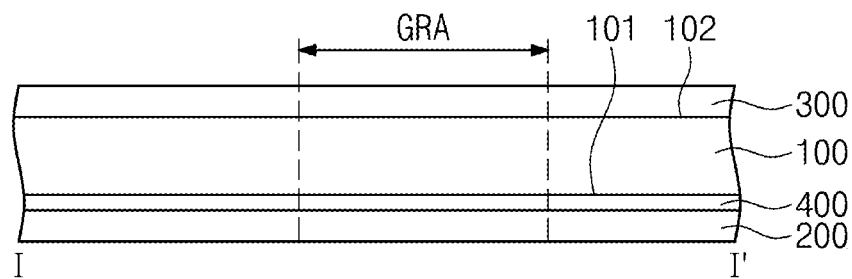
FIG. 4 is a cross-sectional view taken along a line I-I' of FIG. 3.
Figure 4:

As shown in FIG. 4, the display module 1000 includes a display panel 100, a first film 200, a second film 300, and an adhesive layer 400.

The display panel 100 includes a lower surface 101 and an upper surface 102. Hereinafter, a direction substantially vertical to the lower surface 101 or the upper surface 102 of the display panel 100 and toward the upper surface 102 from the lower surface 101 of the display panel 100 is referred to as an upper direction DR3.

The first film 200 is disposed under the lower surface 101 of the display panel 100. The second film 300 is disposed above the upper surface 102 of the display panel 100. The adhesive layer 400 is disposed between the lower surface 101 of the display panel 100 and the first film 200.

The first film 200 protects the display panel 100. The first film 200 may include polyethylene terephthalate (PET), polyethylene naphthalate (PEN), polypropylene (PP), polycarbonate (PC), polystyrene (PS), polysulfone (PSul), polyethylene (PE), polyphthalamide (PPA), polyethersulfone (PES), polyarylate (PAR), polycarbonate oxide (PCO), or modified polythenylene oxide (MPPO). In the present exemplary embodiment, the first film 200 may include polyethylene terephthalate (PET) as a representative example.

The second film 300 includes a polarizing plate. The polarizing plate blocks an external light incident thereto. The polarizing plate includes a linear polarizing layer and a λ/4 retardation layer. The linear polarizing layer is disposed on the λ/4 retardation layer. The external light sequentially passing through the linear polarizing layer and the λ/4 retardation layer is reflected by a lower portion of the polarizing plate, e.g., a cathode of the display panel 100, and the reflected external light becomes extinct since the reflected external light does not pass through the linear polarizing layer after passing through the λ/4 retardation layer.

The adhesive layer 400 adheres the display panel 100 to the first film 200. The adhesive layer 400 may include a urethane-based material, an acrylic-based material, or a silicon-based material. The adhesive layer 400 may be a pressure-sensitive adhesive layer.

Figure 5:
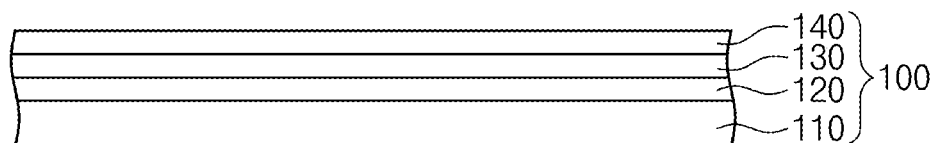
FIG. 5 is a cross-sectional view showing a stacking structure of a display panel of FIG. 4.
Figure 5:
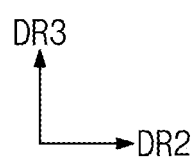
Figure 6:
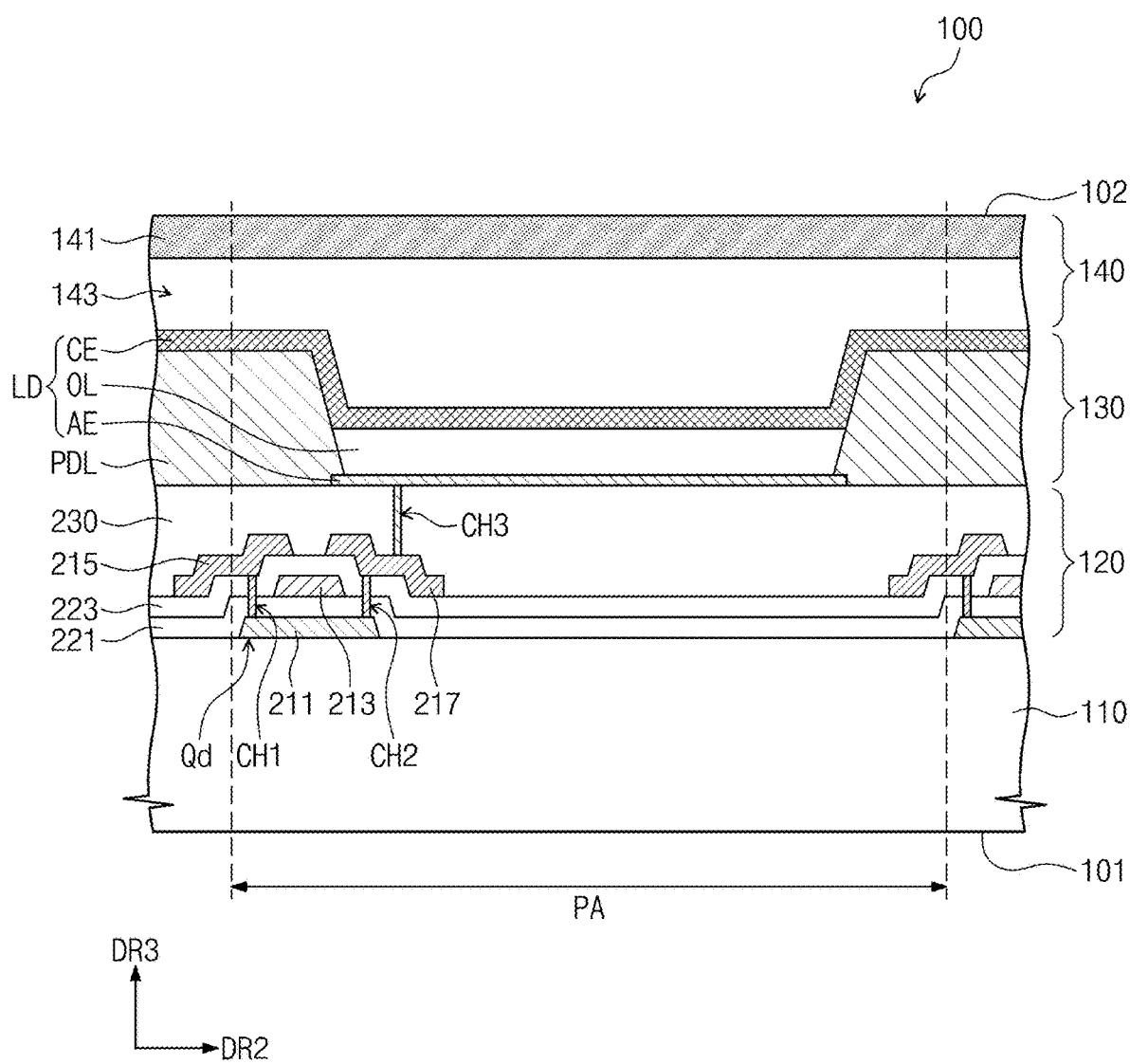
FIG. 6 is a cross-sectional view showing a portion of a display panel corresponding to one pixel area.

FIG. 5 is a cross-sectional view showing a stacking structure of the display panel 100; and FIG. 6 is a cross-sectional view showing a portion of the display panel 100 corresponding to one pixel area. As shown in FIG. 6, one pixel is disposed in one pixel area PA.

The display panel 100 includes a base substrate 110, a driving layer 120, an organic light emitting element layer 130, and a sealing layer 140.

The base substrate 110 provides the lower surface 101 of the display panel 100. The base substrate 110 may be, but is not limited to, a flexible substrate and may include a plastic material having superior thermal resistance and durability, e.g., polyethylene terephthalate (PET), polyethylene naphthalate (PEN), polycarbonate (PC), polyarylate (PAR), polyetherimide (PEI), polyethersulfone (PES), polyimide (PI), etc. The base substrate 110 may include polyimide as a representative example.

The driving layer 120 includes devices to apply signals to the organic light emitting element layer 130. The driving layer 120 includes various signal lines, such as a scan line (not shown), a data line (not shown), a power source line (not shown), a light emitting line (not shown), etc. The driving layer 120 includes a plurality of transistors and capacitors. The transistors include a switching transistor (not shown) and a driving transistor Qd, which are arranged in every one pixel (not shown).

FIG. 6 shows the driving transistor Qd of the driving layer 120 as a representative example. The driving transistor Qd includes an active layer 211, a gate electrode 213, a source electrode 215, and a drain electrode 217.

The active layer 211 is disposed on the base substrate 110. The driving layer 120 further includes a first insulating layer 221 disposed between the active layer 211 and the gate electrode 213. The first insulating layer 221 insulates the active layer 211 from the gate electrode 213. The source electrode 215 and the drain electrode 217 are disposed on the gate electrode 213. The driving layer 120 further includes a second insulating layer 223 disposed between the gate electrode 213 and the source electrode 215 and between the gate electrode 213 and the drain electrode 217. The source electrode 215 and the drain electrode 217 are connected to the active layer 211 respectively through contact holes CH1 and CH2 formed through the first insulating layer 221 and the second insulating layer 223.

The driving layer 120 further includes a protective layer 230 disposed on the source electrode 215 and the drain electrode 217.

The present disclosure is not limited to the structure of the driving transistor Qd shown in FIG. 6, and positions of the active layer 211, the gate electrode 213, the source electrode 215, and the drain electrode 217 may be changed in various ways. For instance, the gate electrode 213 is disposed on the active layer in FIG. 6, but the gate electrode 213 may be disposed under the active layer 211 according to embodiments.

Although a structure of the switching transistor is not shown in FIG. 6, the switching transistor (not shown) may have substantially the same structure as that of the driving transistor Qd. However, the switching transistor may have a structure different from that of the driving transistor Qd according to embodiments. For instance, an active layer (not shown) of the switching transistor (not shown) may be disposed on a layer different from a layer on which the active layer 211 of the driving transistor Qd is disposed.

The organic light emitting element layer 130 includes an organic light emitting diode LD. In the present exemplary embodiment, the organic light emitting diode LD is a front surface light emitting type organic light emitting diode LD, and thus the organic light emitting diode LD emits a light to the upper direction DR3.

The organic light emitting diode LD includes a first electrode AE, an organic layer OL, and a second electrode CE.

The first electrode AE is disposed on the protective layer 230. The first electrode AE is connected to the drain electrode 217 through a contact hole CH3 formed through the protective layer 230.

The first electrode AE may be a pixel electrode or a positive electrode. The first electrode AE may be a transflective electrode or a reflective electrode. In the case where the first electrode AE is the transflective electrode or the reflective electrode, the first electrode AE may include Ag, Mg, Al, Pt, Pd, Au, Ni, Nd, Ir, Cr, or a mixture thereof.

The first electrode AE has a single-layer structure of a metal oxide or a metal or has a multi-layer structure of layers. For instance, the first electrode AE may have a single-layer structure of ITO, Ag, or a mixture of metal, e.g., a mixture of Ag and Mg, a double-layer structure of ITO/Mg or ITO/MgF, or a triple-layer structure of ITO/Ag/ITO, but is not limited thereto or thereby.

The organic layer OL includes an organic light emitting layer containing a low molecular weight or high molecular weight organic material. The organic light emitting layer emits the light. The organic layer OL selectively includes a hole transport layer, a hole injection layer, an electron transport layer, and an electron injection layer in addition to the organic light emitting layer.

Holes and electrons are injected into the organic light emitting layer of the organic layer OL from the first electrode AE and the second electrode CE, and the holes are recombined with the electrons in the organic light emitting layer to generate excitons. The excitons emit energy discharged when an excited state returns to a ground state as light.

The second electrode CE is disposed on the organic layer OL. The second electrode CE may be a common electrode or a negative electrode. The second electrode CE may be a transmissive electrode or a transflective electrode. In the case where the second electrode CE is the transmissive electrode or the transflective electrode, the second electrode CE may include Li, Ca, LiF/Ca, LiF/Al, Al, Mg, BaF, Ba, Ag, a compound thereof, or a mixture thereof, e.g., a mixture of Ag and Mg.

The second electrode CE includes an auxiliary electrode. The auxiliary electrode includes a layer formed by depositing the above-mentioned materials towards the organic light emitting layer and a transparent conductive oxide formed on the layer, such as indium tin oxide, indium zinc oxide, zinc oxide, indium tin zinc oxide, Mo, Ti, Ag, etc.

The organic light emitting element layer 130 further includes a pixel definition layer PDL disposed on the protective layer 230. The pixel definition layer PDL is disposed to overlap with a boundary of the pixel area PA when viewed in a plan view.

The sealing layer 140 is disposed above the organic light emitting element layer 130. The sealing layer 140 provides the upper surface 102 of the display panel 100. The sealing layer 140 blocks the organic light emitting element layer 130 from external moisture and oxygen. The sealing layer 140 includes a sealing substrate 141 and a sealing member (not shown). The sealing member (not shown) is disposed along an edge of the sealing substrate 141 and seals the organic light emitting diode LD together with the sealing substrate 141. An inner space 143 defined by the sealing substrate 141 and the sealing member (not shown) is maintained in a vacuum state. However, the inner space 143 may be filled with nitrogen (N2) or with a filling member of an insulating material.

Different from the display panel 100, the sealing layer 140 may have a structure in which an organic layer and an inorganic layer are stacked multiple times.

Figure 7:
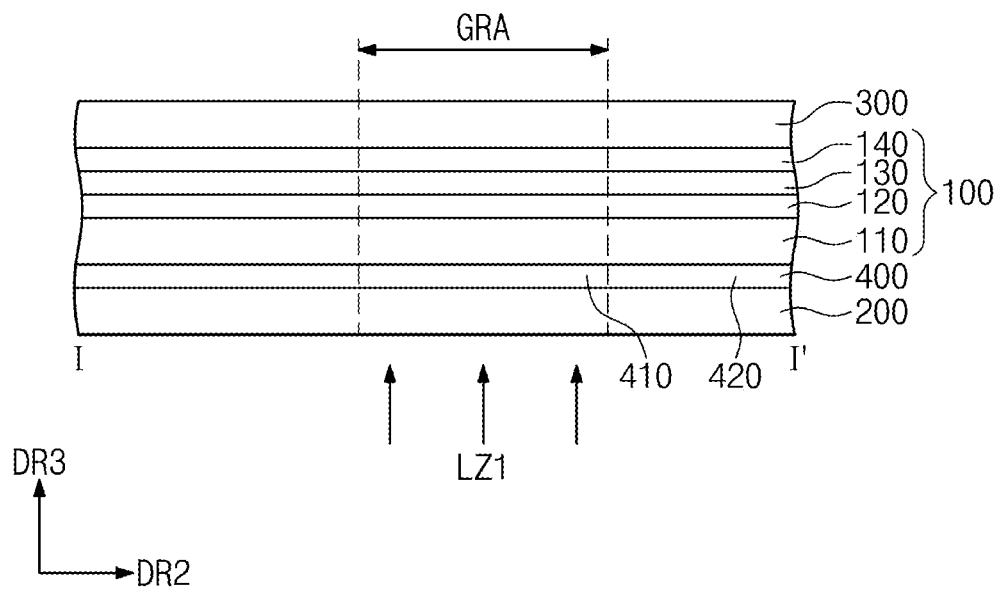
FIGS. 7 to 9 are cross-sectional views taken along the line I-I' of FIG. 3.

Referring to FIG. 7, the adhesive layer 400 includes a first adhesive portion 410 defined in the first area GRA and a second adhesive portion 420 defined outside the first area GRA.

Referring to FIGS. 1 and 7, an adhesive force of the first adhesive portion 410 becomes weaker than an adhesive force of the second adhesive portion 420 (S20).

In an embodiment, in the weakening of the adhesive force (S20), an ultraviolet ray LZ1 is irradiated in the upper direction DR3 from a lower side of the display module 1000 in the first area GRA. The ultraviolet ray LZ1 is irradiated by using a UV laser source.

When the ultraviolet ray LZ1 is irradiated, the adhesive force between the first adhesive portion 410 and the base substrate 110 becomes weak. The adhesive force between the first adhesive portion 410 and the base substrate 110 becomes weak since carbides are generated on the lower surface 101 of the base substrate 110 due to the ultraviolet ray LZ1 or a surface roughness of the lower surface 101 of the base substrate 110 is changed due to the ultraviolet ray LZ1.

When the adhesive force of the first adhesive portion 410 is not weakened, it is difficult to remove a portion of the first film 200 and the first adhesive portion 410, which are disposed in the first area GRA, or the base substrate 110 may be damaged during the removal of the portion of the first film 200 and the first portion 410. Due to operation S20, the portion of the first film 200 and the first portion 410 may be stably removed in the following process.

Figure 8:
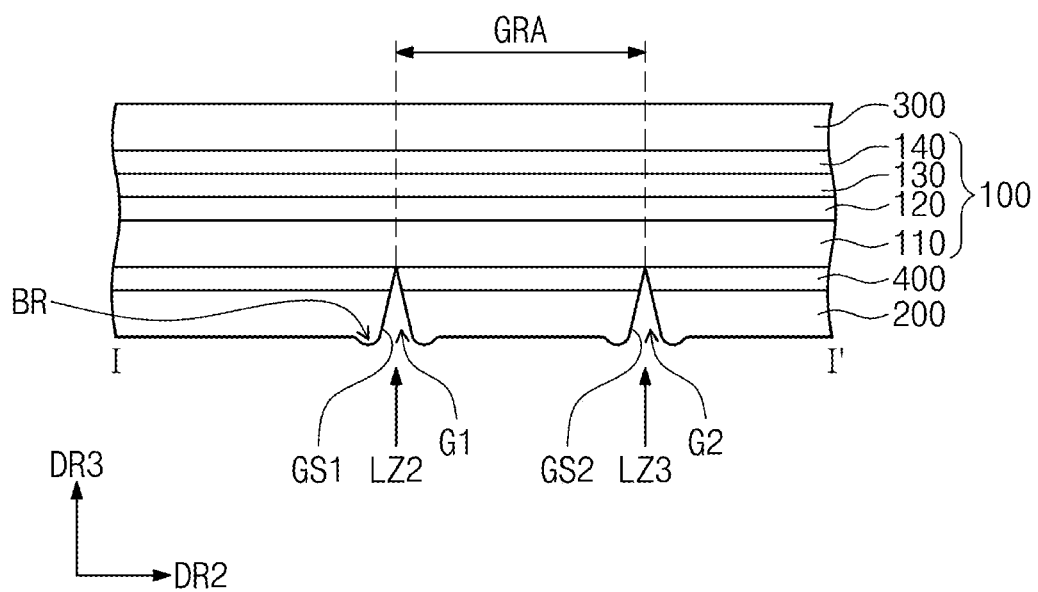

Referring to FIGS. 1, 3, and 8, the first film 200 and the adhesive layer 400 are cut along an edge of the first area GRA (S30).

In the cutting of the first film 200 and the adhesive layer 400 (S30), a laser beam is irradiated in the upper direction DR3 from the lower side of the display module 1000 to cut the first film 200 and the adhesive layer 400.

The laser beam may be irradiated using a $CO_2$ laser source having a high energy efficiency or the UV laser source.

The cutting of the first film 200 and the adhesive layer 400 (S30) includes irradiating a laser beam LZ2 along the first edge EG1 of the first area GRA and irradiating a laser beam LZ3 along the second edge EG2 of the first area GRA.

After the cutting of the first film 200 and the adhesive layer 400 (S30), a first groove G1 is formed in the first film 200 and the adhesive layer 400 to overlap with the first edge EG1 of the first area GRA, and a second groove G2 is formed in the first film 200 and the adhesive layer 400 to overlap with the second edge EG2 of the first area GRA.

Each of the first groove G1 and the second groove G2 has a shape having a width which gradually decreases upward along the upper direction DR3. An inner surface GS1 of the first groove G1 and an inner surface GS2 of the second groove G2 are inclined.

Since the laser beams LZ2 and LZ3 are irradiated in the cutting of the first film 200 and the adhesive layer 400 (S30), a burr BR is formed on the lower surface of the first film 200 to be adjacent to the first and second grooves G1 and G2. The burr BR may be formed by a portion of the film 200, which is melted by heat energy of the laser beams LZ2 and LZ3.

If the cutting of the first film 200 and the adhesive layer 400 (S30) is performed prior to the weakening of the adhesive force of the first adhesive portion 410 (S20), the ultraviolet ray LZ1 irradiated in the upper direction DR3 is refracted by the inner surface GS1 of the first groove G1 and the inner surface GS2 of the second groove G2 and irradiated to an area smaller than the first area GRA, and the adhesive force of the adhesive layer disposed at the edge of the first area GRA may not be weakened. However, the present exemplary embodiment does not exclude that the cutting of the first film 200 and the adhesive layer 400 (S30) may be performed prior to the weakening of the adhesive force of the first adhesive portion 410 (S20).

In the present exemplary embodiment, the cutting of the first film 200 and the adhesive layer 400 (S30) may be performed after the weakening of the adhesive force of the first adhesive portion 410 (S20). Thus, the first film 200 and the adhesive layer 400 may be cut after the ultraviolet ray LZ1 is uniformly irradiated to the first area GRA including the edge of the first area GRA in the weakening of the adhesive force of the first adhesive portion 410 (S20).

Figure 9:
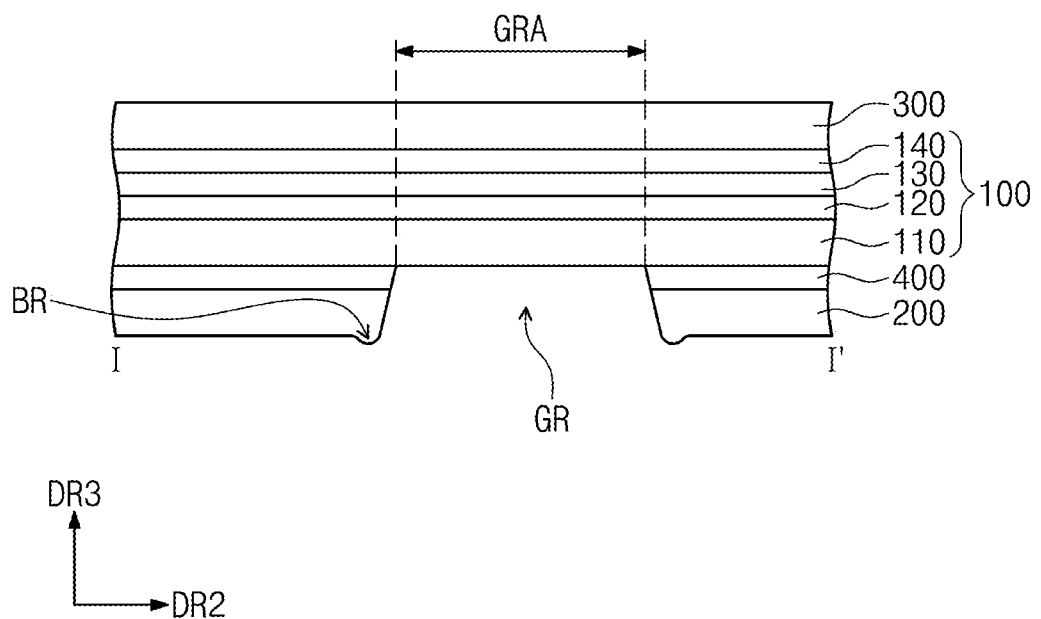

Referring to FIGS. 1 and 9, the portion of the first film 200 and the portion of the adhesive layer 400, which are disposed in the first area GRA, are removed (S40).

Due to the removal of the portion of the first film 200 and the first adhesive portion 410 of the adhesive layer 400 (S40), a groove GR is formed.

According to the manufacturing method of the display device of the present exemplary embodiment, the adhesive layer 400 and the first film 200 are formed on the entire surface of the display panel 100, and then the portion of the adhesive layer 400 and the portion of the first film 200, which are disposed in a target area, may be easily removed. According to the manufacturing method of the display device of the present exemplary embodiment, a manufacturing process may be simplified and a manufacturing cost may be reduced when compared with those of processes of attaching a first film, from which a portion thereof corresponding to a target area is removed, to the display panel 100.

Figure 10A:
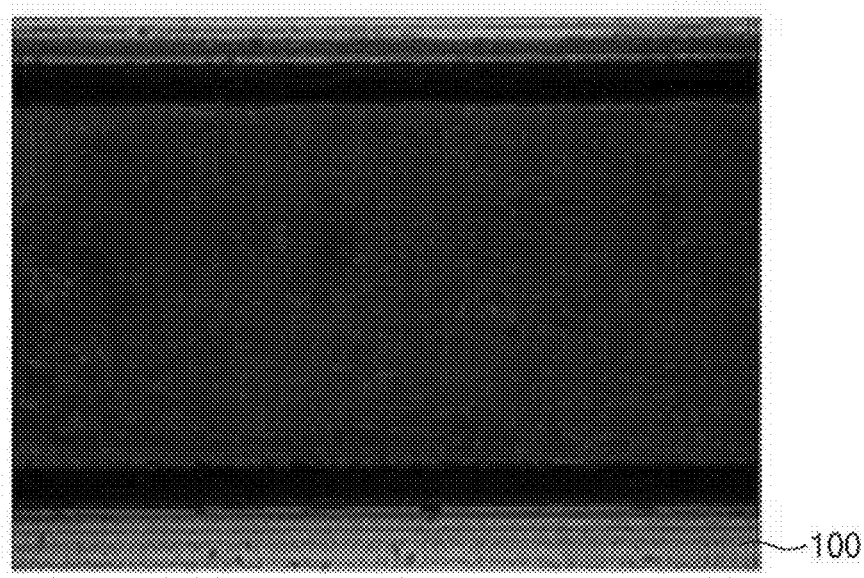
FIG. 10A is a photograph showing a lower surface of a base substrate when a removing operation is performed within one hour after a cutting operation is performed.
Figure 10B:
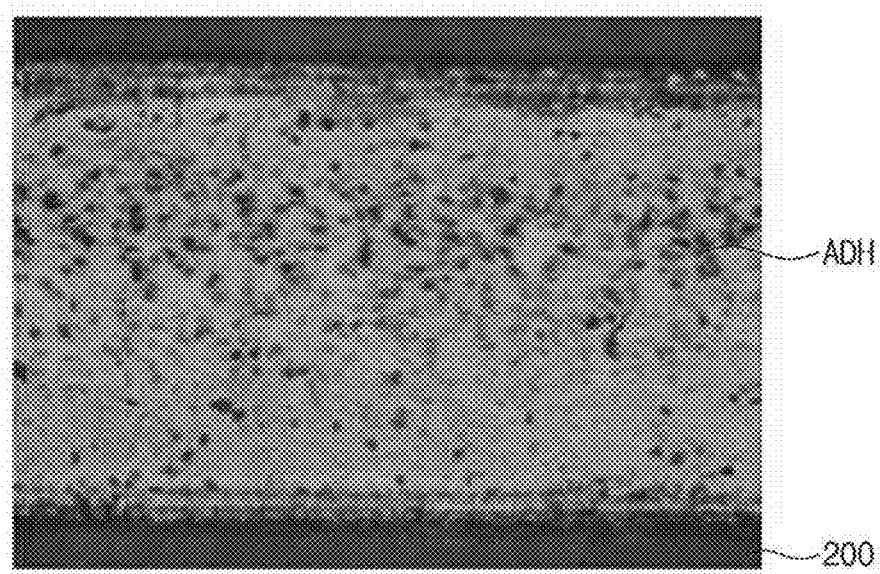
FIG. 10B is a photograph showing a portion of a first film removed in a removing operation when the removing operation is performed within one hour after a cutting operation is performed.

FIG. 10A is a photograph showing a lower surface of a base substrate when the removing operation S40 is performed within one hour after the cutting operation S30 is performed; and FIG. 10B is a photograph showing a portion of a first film removed in the removing operation S40 when the removing operation S40 is performed within one hour after the cutting operation S30 is performed.

Figure 11A:
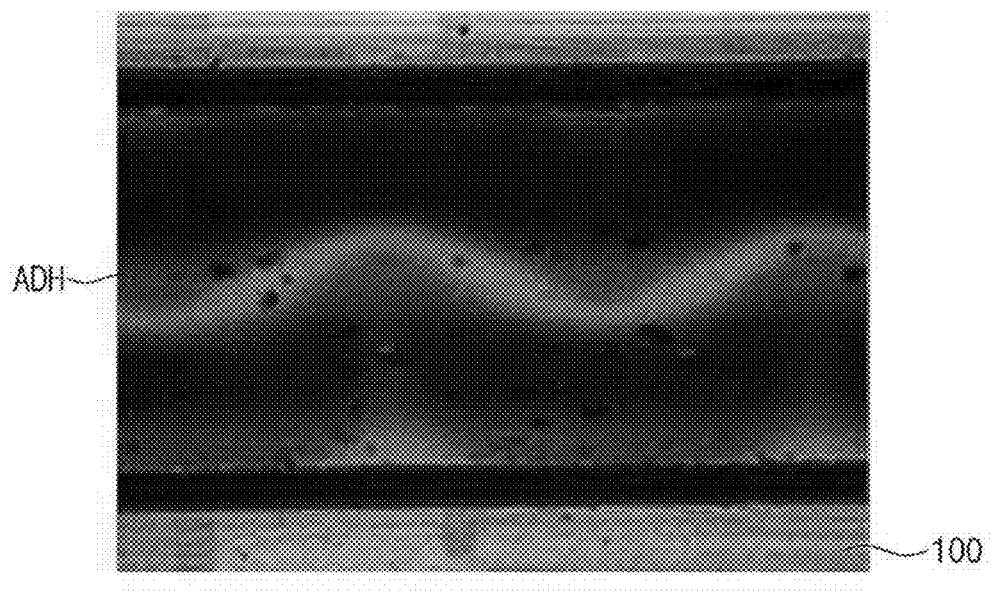
FIG. 11A is a photograph showing a lower surface of a base substrate when a removing operation is performed after one hour elapses from a time point at which a cutting operation is performed.
Figure 11B:
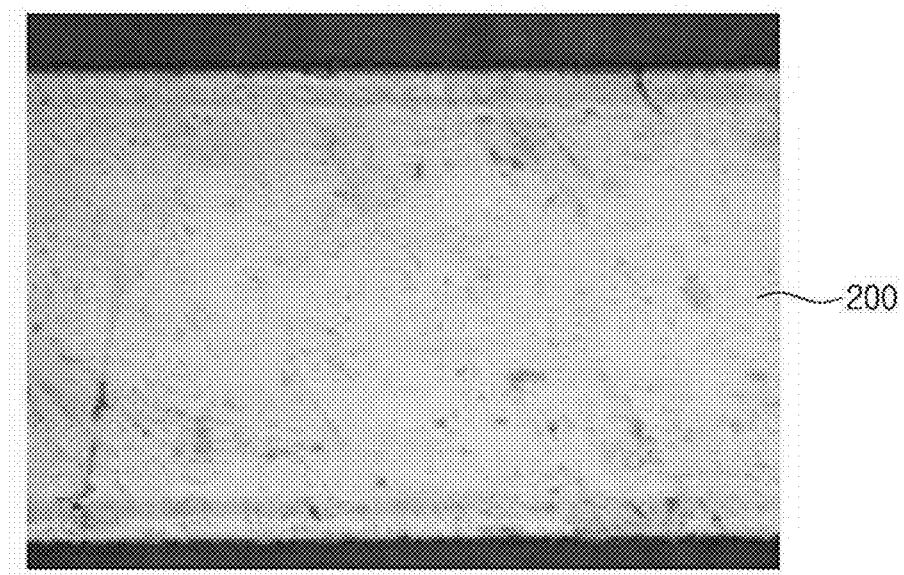
FIG. 11B is a photograph showing a portion of a first film removed in a removing operation when the removing operation is performed after one hour elapses from a time point at which a cutting operation is performed.

FIG. 11A is a photograph showing a lower surface of a base substrate when the removing operation S40 is performed after one hour elapses from a time point at which the cutting operation S30 is performed; and FIG. 11B is a photograph showing a portion of a first film removed in the removing operation S40 when the removing operation S40 is performed after one hour elapses from a time point at which the cutting operation S30 is performed.

Referring to FIGS. 10A and 10B, when the removing of the portion of the first film 200 and the portion of the adhesive layer 400 (S40) is performed within one hour after performing the cutting of the first film 200 and the adhesive layer 400 (S30), a portion ADH of the adhesive layer 400 is removed with the portion of the first film 200. An adhesive force between the lower surface 101 of the base substrate 110 is smaller than that between the first film 200 and the adhesive layer 400 during the one hour after performing the cutting of the first film 200 and the adhesive layer 400 (S30).

Referring to FIGS. 11A and 11B, when the removing of the portion of the first film 200 and the portion of the adhesive layer 400 (S40) is performed after one hour from a time point at which the cutting of the first film 200 and the adhesive layer 400 (S30) is performed, the portion ADH of the adhesive layer 400 remains on the lower surface 101 of the base substrate 110, and only the portion of the first film 200 is removed.

Referring to FIGS. 1 and 9 again, in the present exemplary embodiment, the removing of the portion of the first film 200 and the portion of the adhesive layer 400 (S40) may be performed within one hour after performing the cutting of the first film 200 and the adhesive layer 400 (S30). Accordingly, after the removing of the portion of the first film 200 and the portion of the adhesive layer 400 (S40) is performed, the portion ADH of the adhesive layer 400 is removed, and the lower surface 101 of the base substrate 110 is exposed.

Then, the display modules 1000 may be separated from the mother substrate 2000 by removing the dummy part DM of the mother substrate 2000. However, the process of separating the display modules 1000 from the mother substrate 2000 may be performed prior to the weakening process (S20), the cutting process (S30), and the removing process (S40).

The display module 1000 is bent with respect to a reference axis defined in the first area GRA and extending in the first direction DR1. In this case, the display module 1000 may be bent such that two parts of the first film 200, which are separated by the groove GR, are closer to each other.

Figure 12:
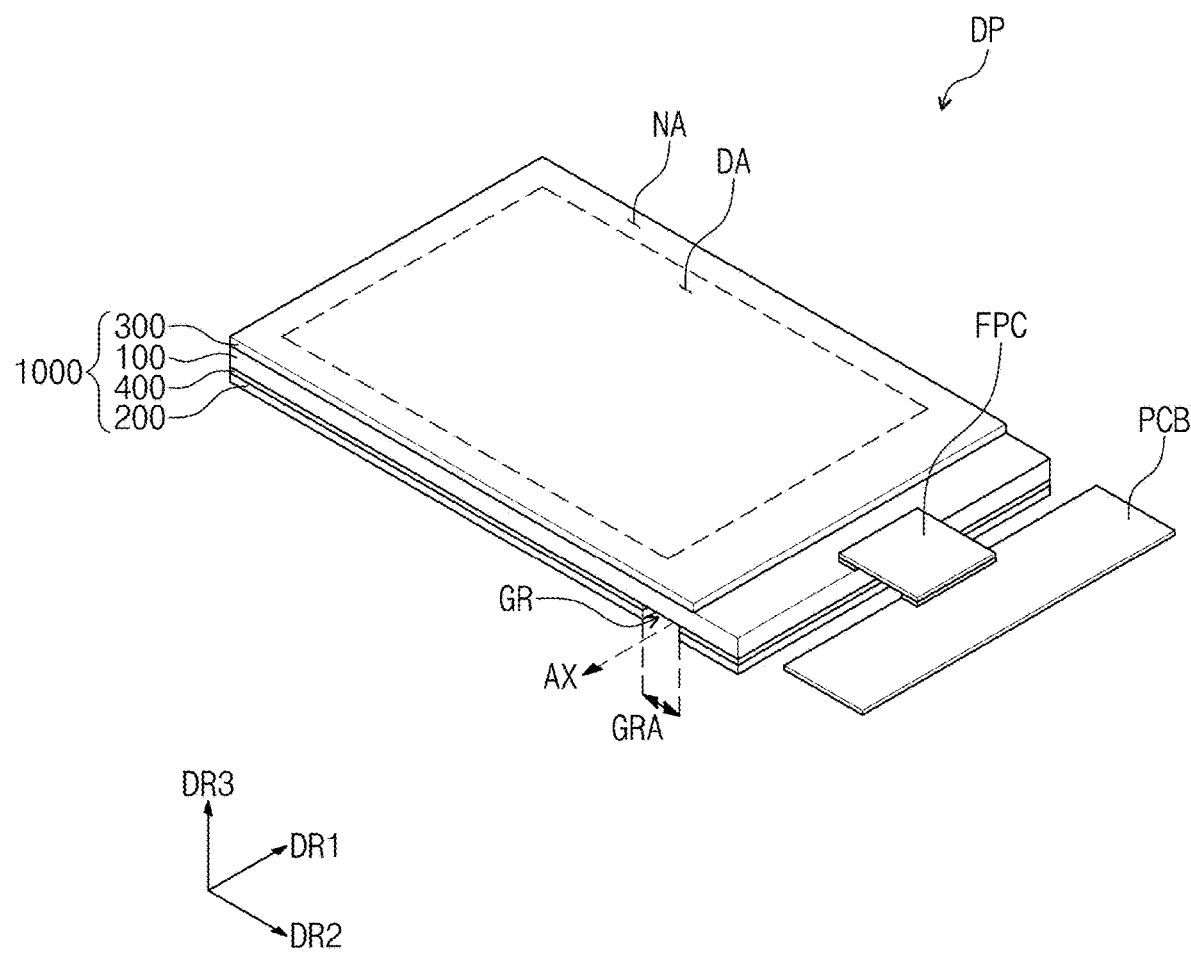
FIG. 12 is a perspective view showing an organic light emitting display device according to an exemplary embodiment of the present disclosure.
Figure 13:
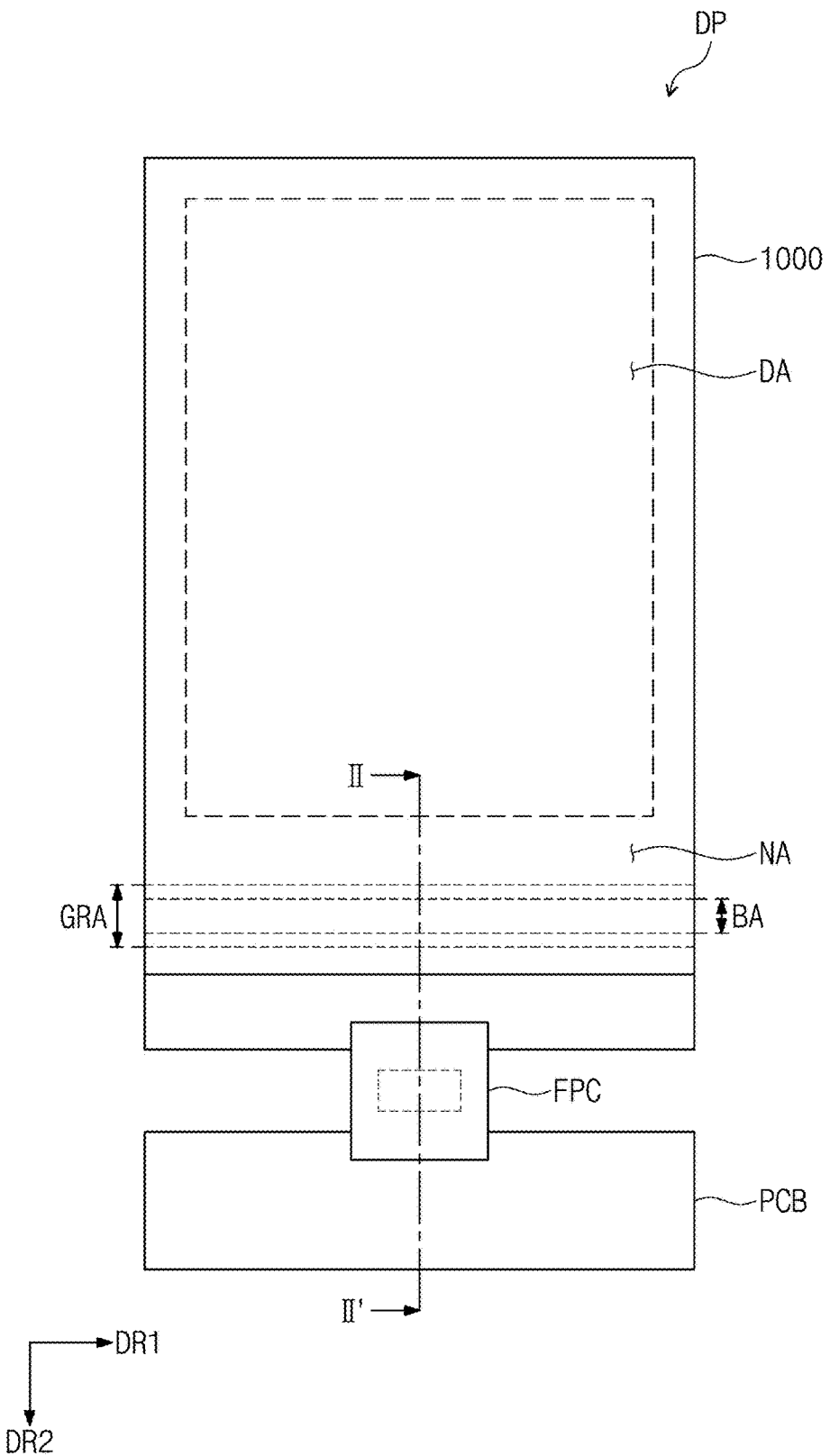
FIG. 13 is a plan view showing the organic light emitting display device of FIG. 12.

FIG. 12 is a perspective view showing an organic light emitting display device according to an exemplary embodiment of the present disclosure; FIG. 13 is a plan view showing the organic light emitting display device of FIG. 12; FIG. 14 is a cross-sectional view taken along a line II-II' of FIG. 13; and FIG. 15 is a cross-sectional view taken along the line II-II' of FIG. 13 when the organic light emitting display device is bent.

Referring to FIGS. 12 to 15, an organic light emitting display device DP includes the display module 1000, a flexible printed circuit board FPC, and a printed circuit board PCB.

The flexible printed circuit board FPC includes a flexible wiring board 122 and a driving circuit chip 125. The driving circuit chip 125 is electrically connected to wirings of the flexible wiring board 122.

In the case where the flexible printed circuit board FPC includes the driving circuit chip 125, data pads electrically connected to data lines and control signal pads electrically connected to control signal lines are arranged in a pad area (not shown) of the display panel 100. The data lines are connected to transistors arranged in the pixel, and the control signal lines are connected to a scan driving circuit. In the present exemplary embodiment, the flexible printed circuit board FPC is provided in a chip-on-film package, but is not limited thereto or thereby. According to another embodiment, the driving circuit chip 125 may be mounted on the non-display area NA of the display panel 100, and the flexible printed circuit board FPC may be a flexible wiring board.

The printed circuit board PCB is electrically connected to the display panel 100 through the flexible wiring board 122 to transmit and receive signals to and from the driving circuit chip 125. The printed circuit board PCB provides at least one of image data, a control signal, and a power source voltage to the display panel 100 or the flexible printed circuit board FPC. The printed circuit board PCB may include active elements and passive elements. The printed circuit board PCB may include a pad part (not shown) connected to the flexible printed circuit board FPC.

The display module 1000 has a structure formed by the manufacturing method of the organic light emitting display device described with reference to FIGS. 1 to 9. The display module 1000 will be described in further detail, and the same descriptions as those of FIGS. 1 to 9 will not be reiterated.

The display module 1000 displays the image to the upper direction DR3.

The display module 1000 may be bent with respect to a reference axis AX extending in the first direction DR1. The reference axis AX may be defined under the display module 1000. The display module 1000 may be bent such that two parts of the first film 200, which are divided by the groove GR, are closer to each other.

The display module 1000 may be bent in the first area GRA. A bending area BA may be defined in the display module 1000. The display module 1000 may be flat in an area other than the bending area BA. The bending area BA may have a width smaller than that of the first area GRA.

Since the adhesive layer 400 and the first film 200 have resilience when the adhesive layer 400 and the first film 200 are bent and the display module 1000 requires more force to maintain the bent state as a thickness of the display module 1000 increases, removing the adhesive layer 400 and the first film 200 in the bending area BA facilitates bending the display module 1000. According to the display device of the present exemplary embodiment, the groove GR is provided to the first film 200 and the adhesive layer 400 to overlap with the bending area BA, and thus a radius of curvature of the display module 1000 becomes small in the bending area BA.

FIGS. 16 to 19 are cross-sectional views showing display modules according to exemplary embodiments of the present disclosure.

Display modules 1001 to 1004 will be described in further detail with reference to FIGS. 16 to 19.

Each of the display modules 1001 to 1004 may include the display panel 100, the first film 200, the second film 300, and the adhesive layer 400. A film groove GR1 may be defined in the first film 200 to overlap with the first area GRA. A groove GR2 may be defined in the adhesive layer 400 to overlap with the first area GRA.

Figure 16:
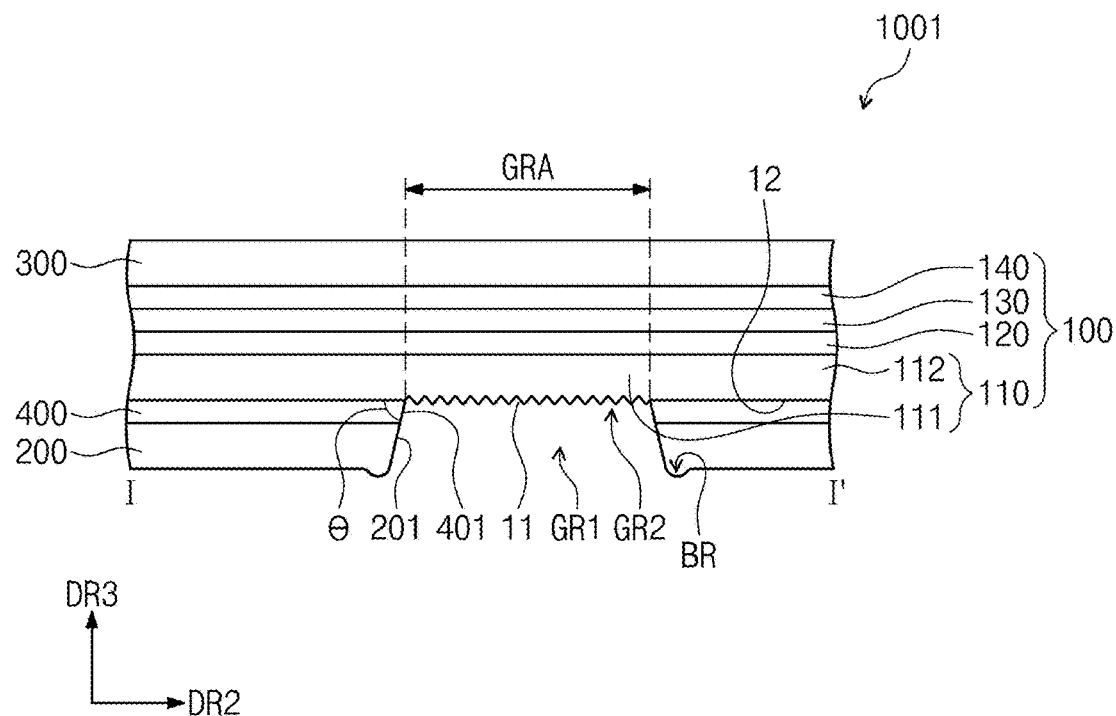
FIGS. 16 to 19 are cross-sectional views showing display modules according to exemplary embodiments of the present disclosure.

In the display module 1001 shown in FIG. 16, the base substrate 110 includes a first base substrate portion 111 disposed in the first area GRA and a second base substrate portion 112 disposed outside the first area GRA. A first part of a lower surface of the display module 1001 corresponds to a lower surface 11 of the first base substrate portion 111, and a second part of the lower surface of the display module 1001 corresponds to a lower surface 12 of the second base substrate portion 112.

According to the display module 1001 shown in FIG. 16, a surface roughness of the lower surface 11 of the first base substrate portion 111 may be greater than a surface roughness of the lower surface 12 of the second base substrate portion 112.

When the weakening of the adhesive force (S20) described with reference to FIGS. 1 and 7 is performed, a portion of the lower surface 11 of the first base substrate portion 111 is carbonized by the ultraviolet ray LZ1. Accordingly, carbides may be generated on the lower surface 11 of the first base substrate portion 111, and the carbides may be removed. Due to the generation and removal of the carbides, the surface roughness of the lower surface 11 of the first base substrate portion 111 may be greater than that of the lower surface 12 of the second base substrate portion 112 onto which the ultraviolet ray LZ1 is not irradiated.

The lower surface 11 of the first base substrate portion 111 may be exposed through the film groove GR1 and the groove GR2. The lower surface 12 of the second base substrate 112 portion is overlapped with the adhesive layer 400 and the first film 200, and thus the lower surface 12 of the second base substrate portion 112 is not exposed.

An inner surface 201 of the first film 200 providing the film groove GR1 may be connected to an inner surface 401 of the adhesive layer 400 providing the groove GR2. In the embodiment shown in FIG. 16, the inner surface 201 of the first film 200 and the inner surface 401 of the adhesive layer 400 have a straight line shape, but may have a curved shape according to other embodiments.

An angle (θ) between the lower surface 12 of the second base substrate portion 112 (e.g., a lower surface of the display panel) and each of the inner surface 201 of the first film 200 and the inner surface 401 of the adhesive layer 400 may be an acute angle. This is because the cutting of the first film and the adhesive layer (S30) is performed by irradiating the laser beam to the upper direction DR3.

The display module 1001 may include a burr BR disposed on the lower surface of the first film 200 adjacent to the film groove GR1. The burr BR may be formed through the cutting of the first film and the adhesive layer (S30).

Figure 17:
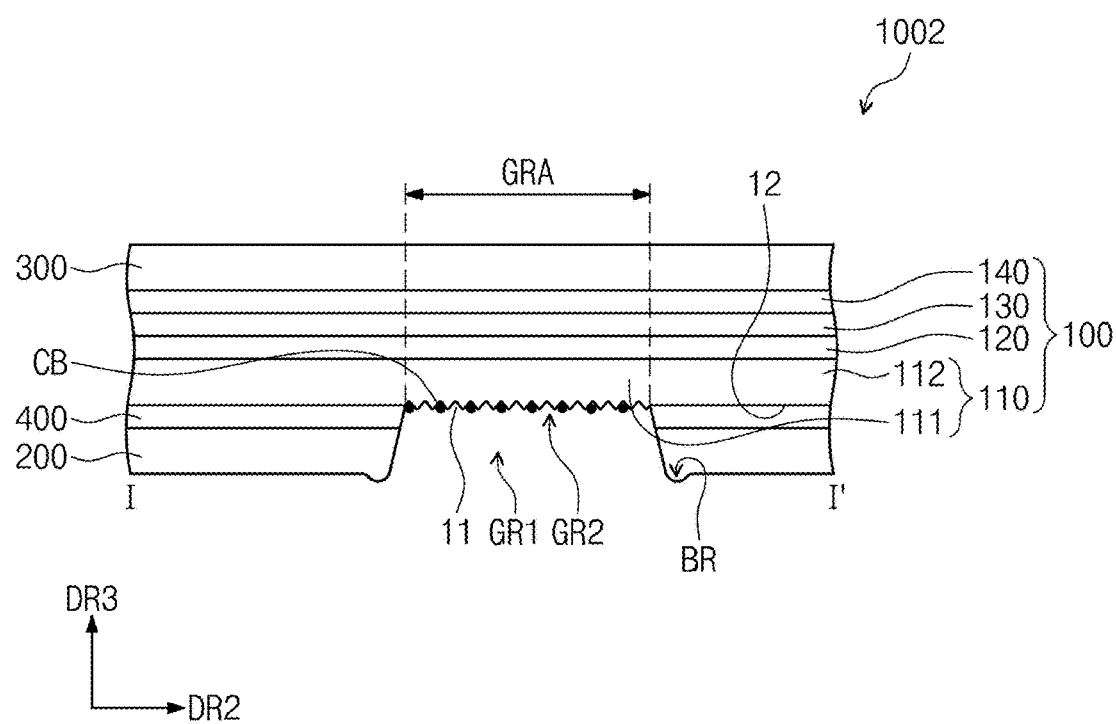

The display module 1002 shown in FIG. 17 may include carbides CB. The carbides CB may be disposed on the lower surface 11 of the first base substrate portion 111. In further detail, the lower surface 11 of the first base substrate portion 111 may have a concave-convex shape, and the carbides CB may be disposed in a convex portion.

The carbides CB may be generated by the weakening of the adhesive force (S20) described with reference to FIGS. 1 and 7 and may remain in a part of a final product. Accordingly, the carbides CB are not on the lower surface 12 of the second base substrate portion 112.

Figure 18:
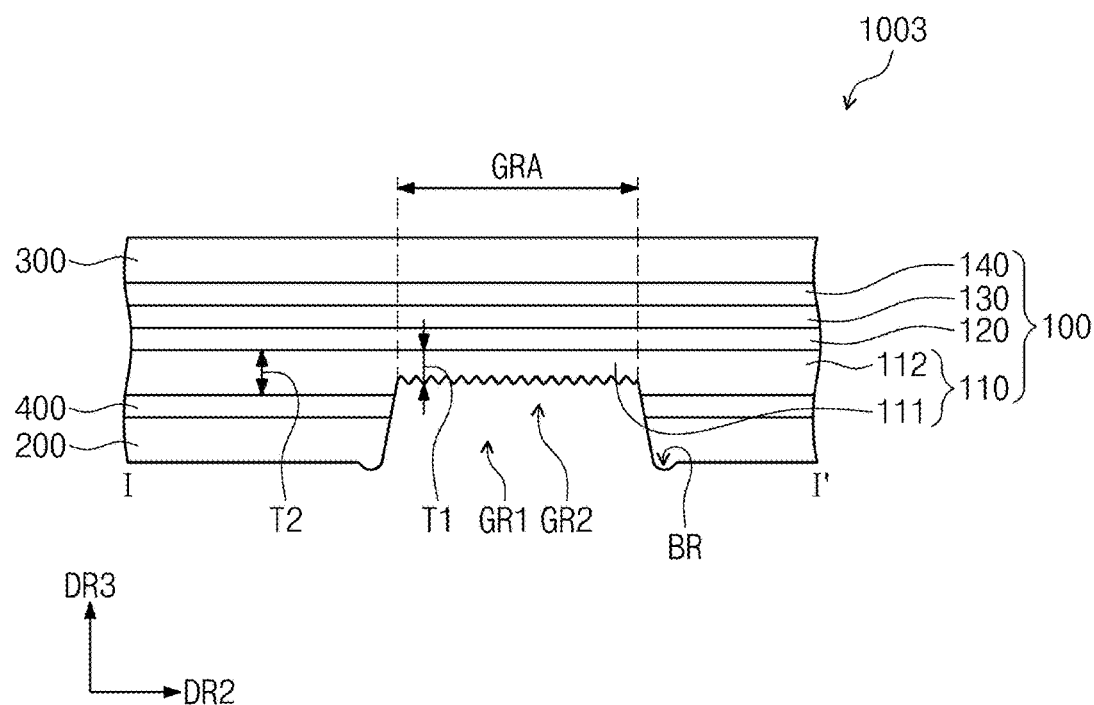

According to the display module 1003 shown in FIG. 18, the first base substrate portion 111 has a first thickness T1, and the second base substrate portion 112 has a second thickness T2 greater than the first thickness T1.

When the weakening of the adhesive force (S20) described with reference to FIGS. 1 and 7 is performed, a portion of the first base substrate portion 111 is carbonized by the ultraviolet ray LZ1, or a portion of the first base substrate portion 111 is removed in the removing of the portion of the first film and the portion of the adhesive layer (S40). As a result, a structure of the display module 1003 shown in FIG. 18 may be formed.

Figure 19:
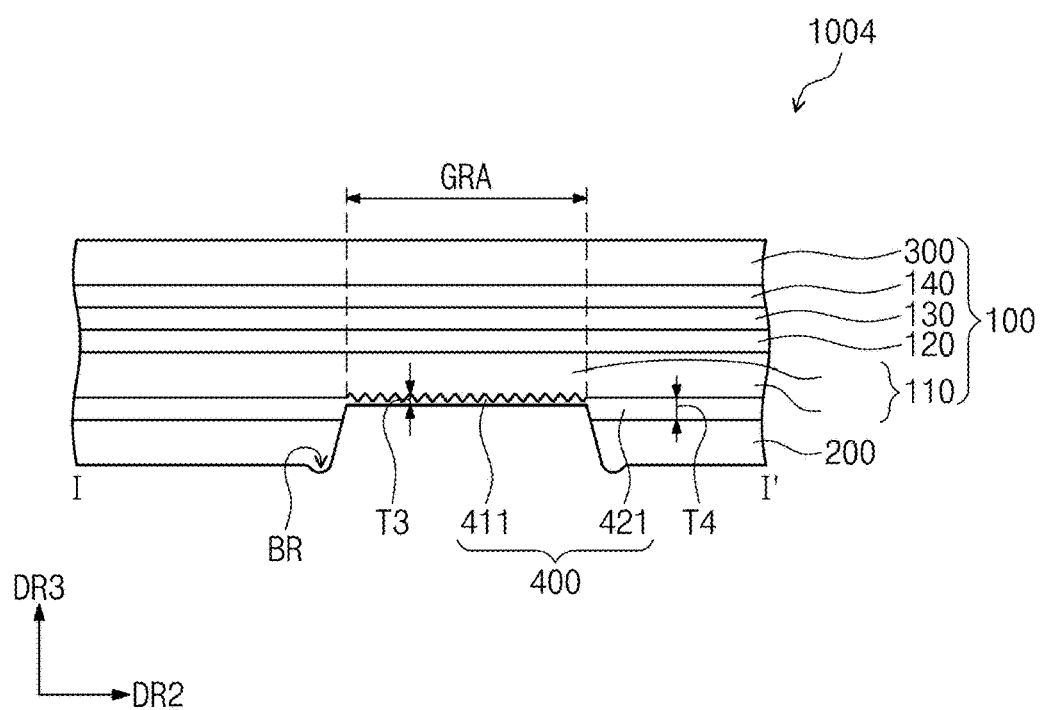

According to the display module 1004 shown in FIG. 19, the lower surface 11 of the first base substrate portion 111 may be covered by the adhesive layer 400. The adhesive layer 400 may include a first adhesive layer portion 411 disposed in the first area GRA and a second adhesive layer portion 421 disposed outside the first area GRA.

The first adhesive layer portion 411 has a third thickness T3, and the second adhesive layer portion 421 has a fourth thickness T4 greater than the third thickness T3.

In the removing of the portion of the first film and the portion of the adhesive layer (S40) described with reference to FIGS. 1 and 9, the adhesive layer 400 may not be completely removed from the first area GRA, and thus the first adhesive layer portion 411 may remain.

Figure 20:
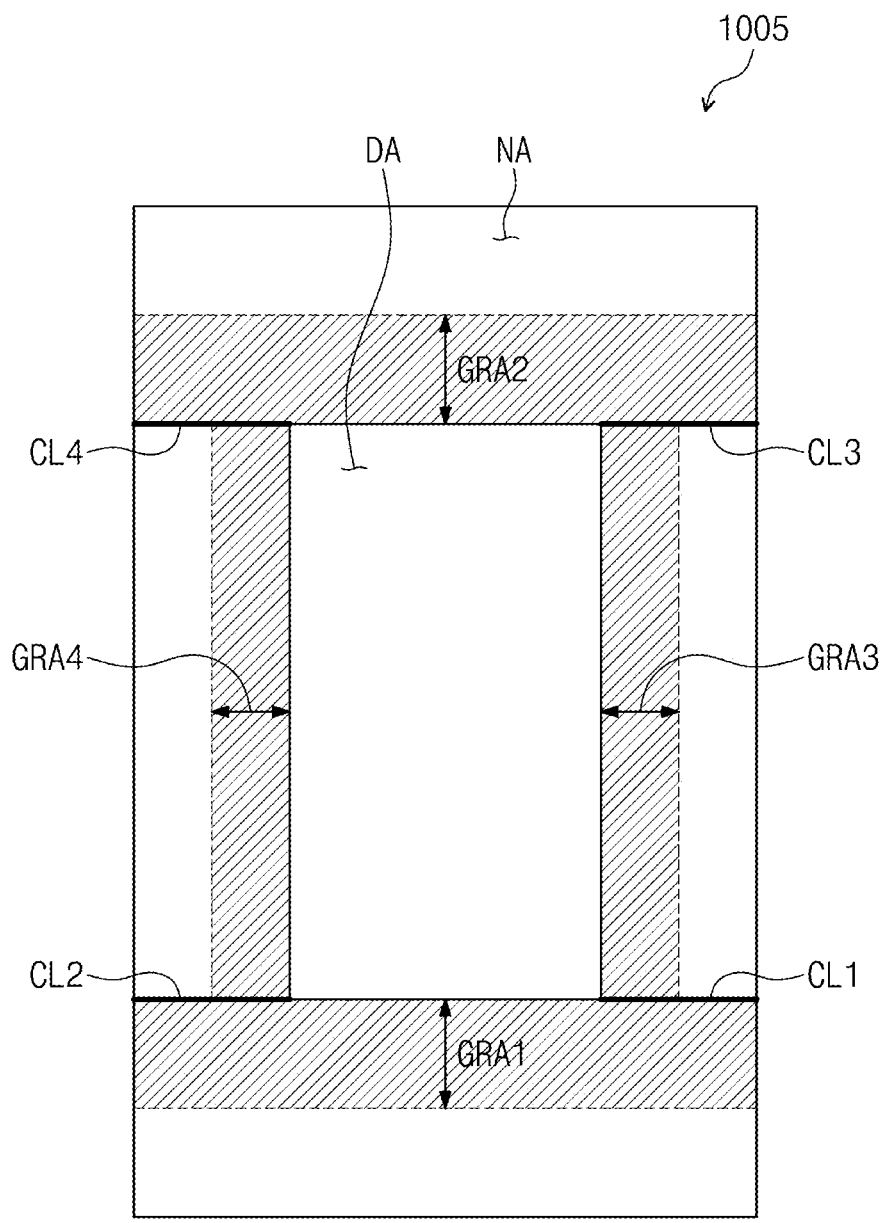
FIG. 20 is a plan view showing a display module according to another exemplary embodiment of the present disclosure.
Figure 21:
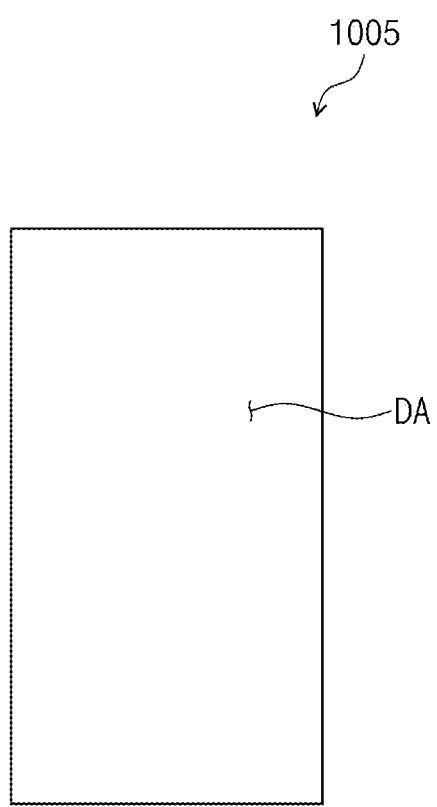
FIG. 21 is a plan view showing the display module of FIG. 20 in a bent state.

FIG. 20 is a plan view showing a display module according to another exemplary embodiment of the present disclosure; and FIG. 21 is a plan view showing the display module of FIG. 20 in a bent state.

Referring to FIG. 20, a display module 1005 may include a display area DA and a non-display area NA defined therein. The non-display area NA surrounds the display area DA. The non-display area NA may include first to fourth areas GRA1 to GRA4.

The display module 1005 may have substantially the same layer structure as one of the display modules 1001 to 1004 described with reference to FIGS. 16 to 19.

The weakening operation (S20), the cutting operation (S30), and the removing operation (S40) shown in FIG. 1 may be performed on the first to fourth areas GRA1 to GRA4. Accordingly, the display module 1005 may have a shape in which the first film 200 and the adhesive layer 400 are removed from the first to fourth areas GRA1 to GRA4.

First to fourth cutting lines CL1 to CL4 are provided to the display module 1005. The display module 1005 may be cut along the first to fourth cutting lines CL1 to CL4.

Referring to FIGS. 20 and 21, the display module 1005 may be bent with respect to a line extending in the first direction DR1 in each of the first and second areas GRA1 and GRA2. In addition, the display module 1005 may be bent with respect to a line extending in the second direction DR2 in each of the third and fourth areas GRA3 and GRA4.

According to the display module 1005 shown in FIGS. 20 and 21, the first film 200 and the adhesive layer 400 are removed from the first to fourth areas GRA1 to GRA4 defined respectively along four sides of the display module 1005, and the display module 1005 is bent along the four sides, but is not limited thereto or thereby. That is, the first film 200 and the adhesive layer 400 may be removed from two or three sides of the display modules 1005, and the display module 1005 may be bent along two or three sides.

Figure 22:
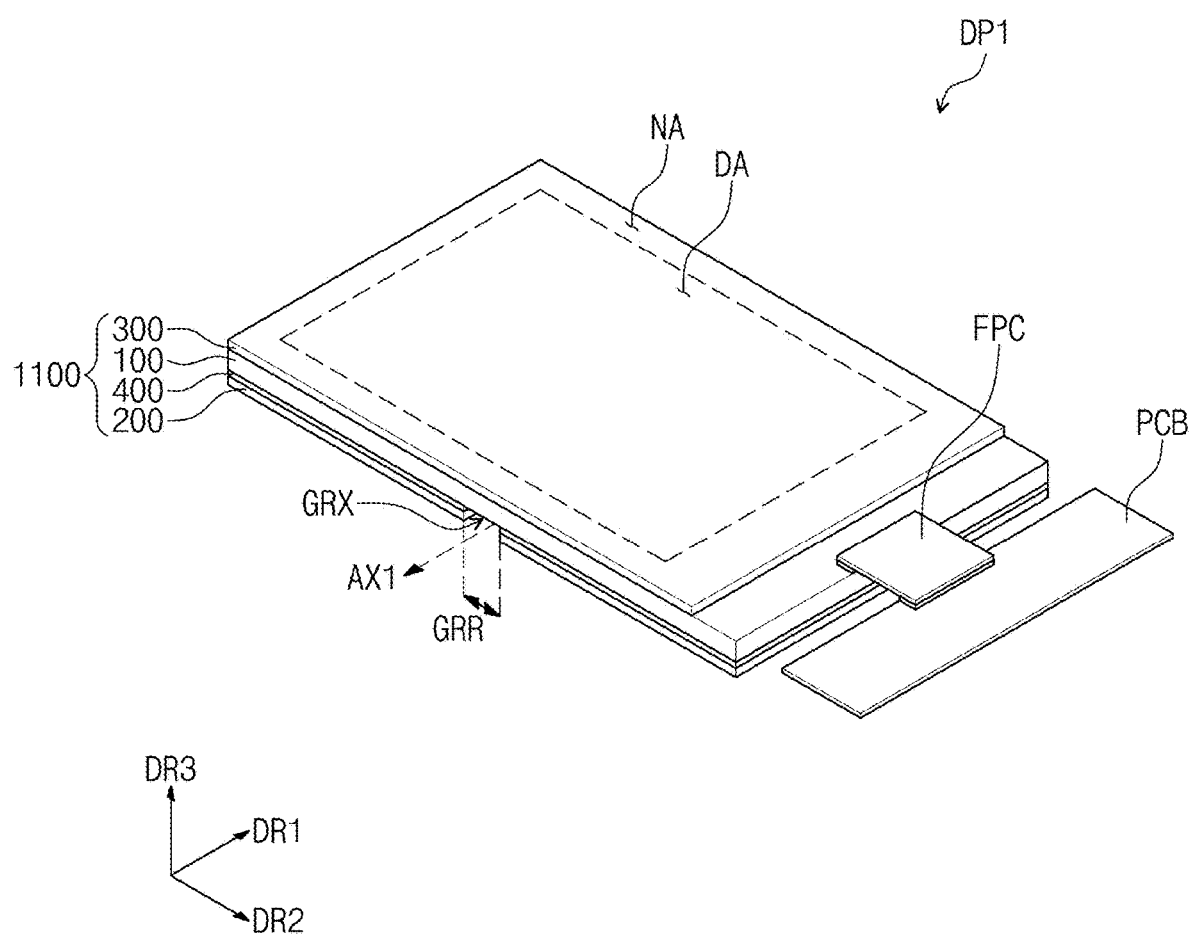
FIG. 22 is a perspective view showing an organic light emitting display device according to another exemplary embodiment of the present disclosure.
Figure 23:
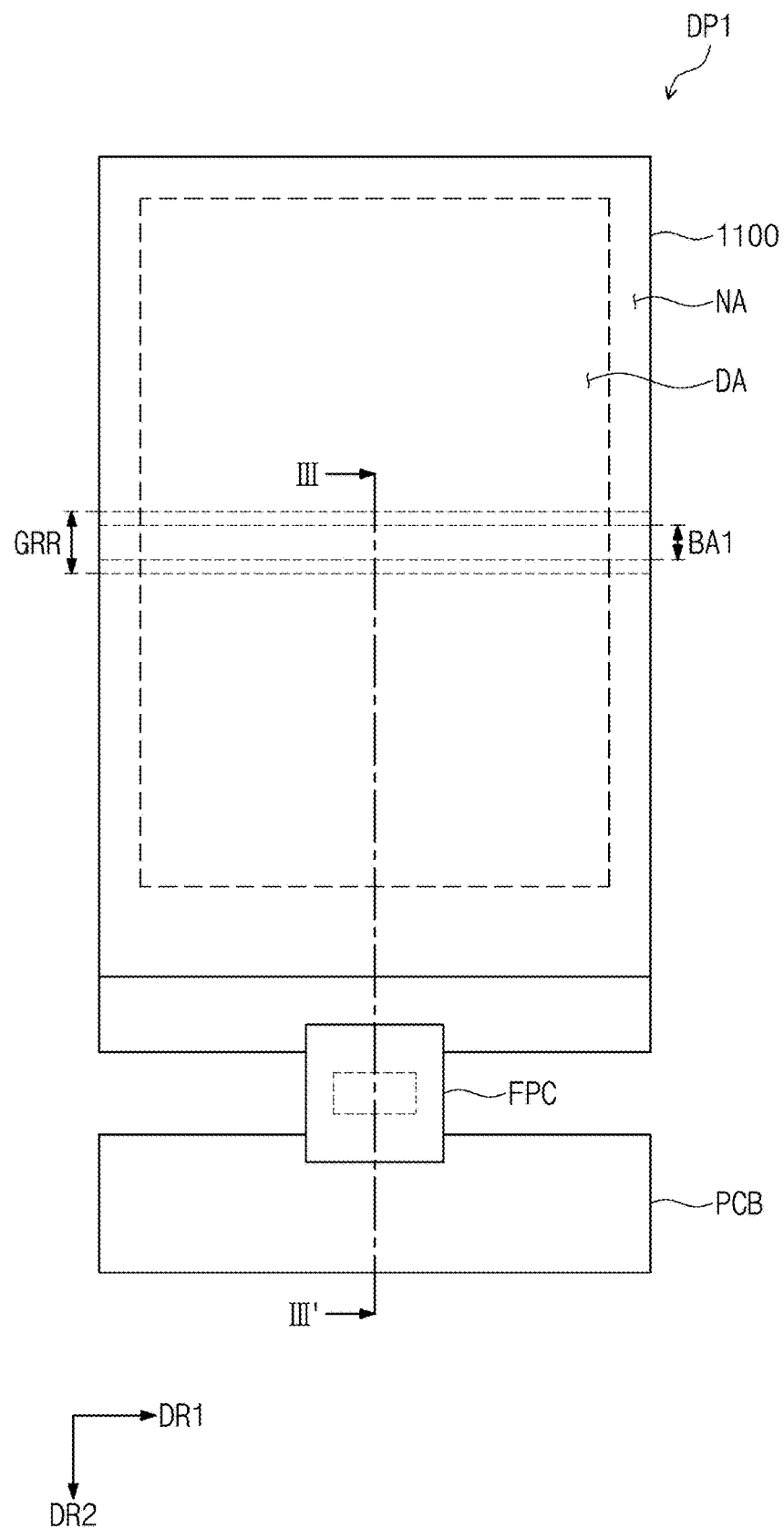
FIG. 23 is a plan view showing the organic light emitting display device of FIG. 22.
Figure 24:
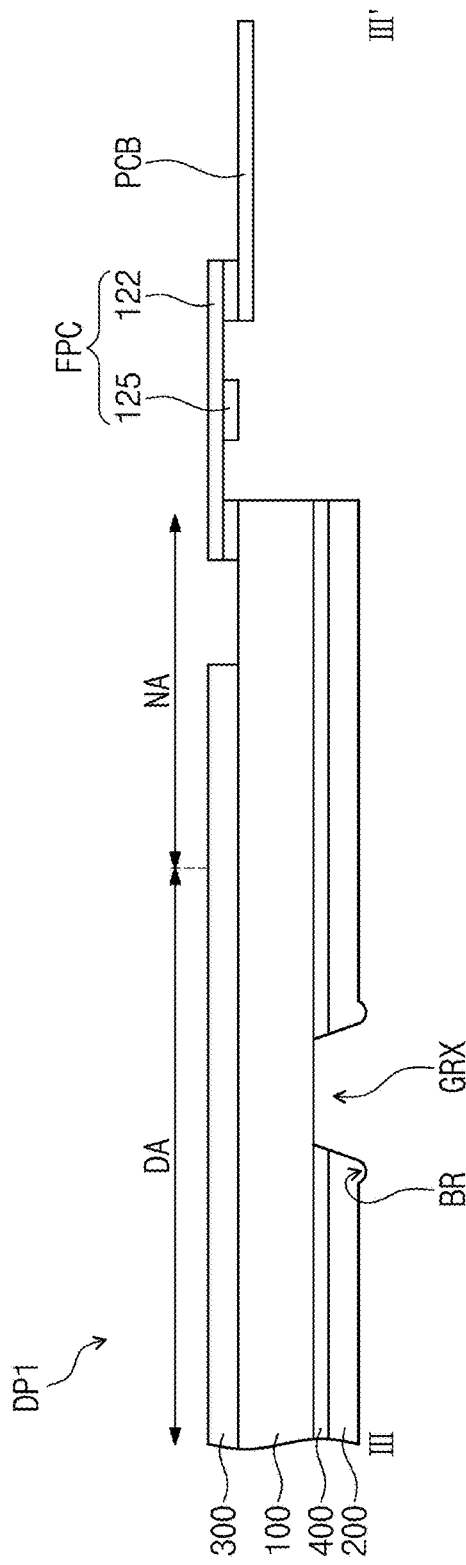
FIG. 24 is a cross-sectional view taken along a line III-III' of FIG. 23.
Figure 25:
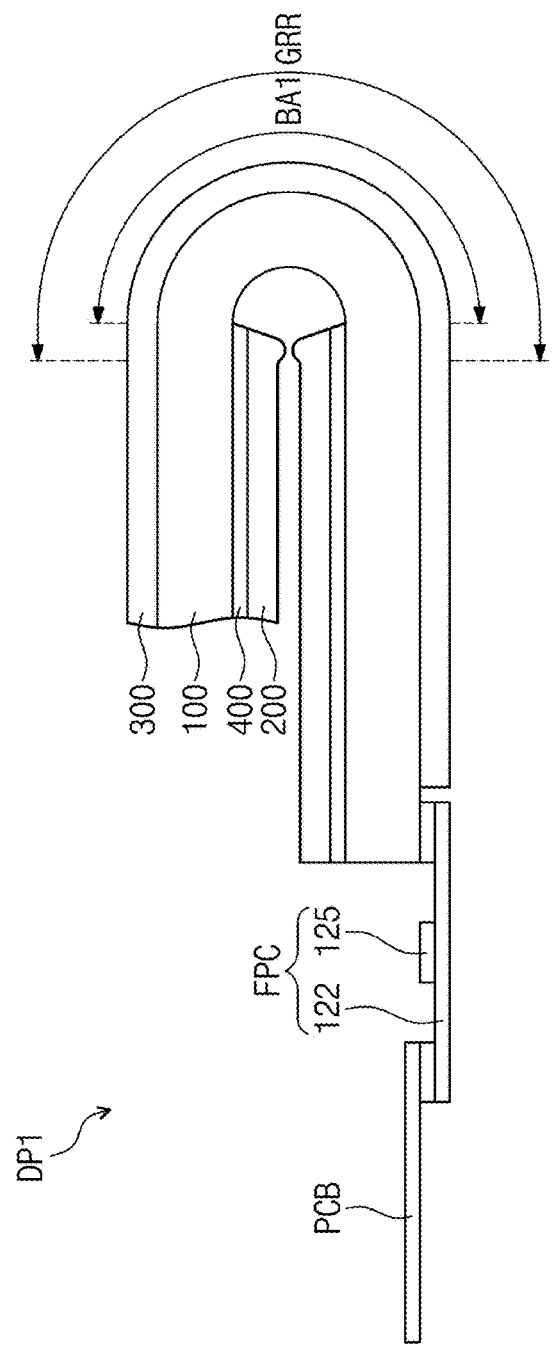
FIG. 25 is a cross-sectional view taken along the line III-III' of FIG. 23 when the organic light emitting display device is bent.

FIG. 22 is a perspective view showing an organic light emitting display device DP1 according to another exemplary embodiment of the present disclosure; FIG. 23 is a plan view showing the organic light emitting display device DP1; FIG. 24 is a cross-sectional view taken along a line III-III' of FIG. 23; and FIG. 25 is a cross-sectional view taken along the line III-III' of FIG. 23 when the organic light emitting display device DP1 is bent.

The organic light emitting display device DP1 shown in FIGS. 22 to 25 may have the same structure and function as those of the organic light emitting display device DP described with reference to FIGS. 12 to 15 except for a position of a first area, i.e., a position of a groove.

The organic light emitting display device DP1 may include a display module 1100. The display module 1100 may include a display area DA and a non-display area NA defined therein. The display module 1100 may include a first area GRR defined therein.

The first area GRR may be overlapped with the display area DA. The first area GRR may be defined to cross the display area DA. The adhesive layer 400 (e.g., a pressure-sensitive adhesive layer) and the first film 200, which are overlapped with the first area GRR, may be removed. That is, a groove GRX overlapped with the first area GRR may be provided in the first film 200 and the adhesive layer 400.

The display module 1100 may be bent with respect to a reference axis AX1 extending in the first direction DR1. The reference axis AX1 may be defined under the display module 1100. The display module 1100 may be bent such that two parts of the first film 200, which are divided by the groove GRX, are closer to each other.

The display module 1100 may be bent in the first area GRR. A bending area BA1 may be defined in the display module 1100. The display module 1100 may be flat in an area other than the bending area BA1. The bending area BA1 may have a width smaller than a width of the first area GRR. As described above, since the groove GRX overlapped with the bending area BA1 is provided in the first film 200 and the adhesive layer 400, the display module 1100 may be easily bent in the bending area BA1, and the radius of curvature of the display module 1100 may become small.

Although some exemplary embodiments of the present invention have been described, it is to be understood that the present invention is not limited to these exemplary embodiments, but various changes and modifications can be made by one of ordinary skill in the art within the spirit and scope of the present invention as hereinafter claimed.

What is claimed is:

1. A display device, comprising:
   a display panel comprising a first area defined therein and comprising a base substrate defining a lower surface of the display panel, a driving layer on the base substrate, an organic light emitting diode on the driving layer, and a sealing layer covering the organic light emitting diode;
   a first film under the base substrate and comprising a film groove defined therein to overlap with the first area;
   a second film on the sealing layer; and
   an adhesive layer between the base substrate and the first film and comprising an adhesive groove defined therein to overlap with the first area,
   wherein a first portion of the base substrate overlaps with the first area, and a second portion of the base substrate is adjacent to the first portion,
   wherein the first portion of the base substrate comprises carbides.

2. The display device as claimed in claim 1, wherein the base substrate comprises polyimide.

3. The display device as claimed in claim 1, wherein the carbides are arranged randomly in the first portion of the base substrate.

4. The display device as claimed in claim 1, wherein the first portion of the base substrate has a first thickness, and the second portion of the base substrate has a second thickness greater than the first thickness.

5. The display device as claimed in claim 1, wherein a surface roughness of the first portion of the base substrate is greater than a surface roughness of the second portion of the base substrate.

6. The display device of claim 1, wherein an angle between the second portion of the base substrate and each of an inner surface of the first film defining the film groove and an inner surface of the adhesive layer defining the adhesive groove is an acute angle.

7. The display device of claim 1, further comprising a burr on a lower surface of the first film adjacent to the film groove.

8. The display device of claim 1, wherein the display panel comprises a display area to display an image and a non-display area adjacent to the display area, and the first area is defined in the non-display area.

9. The display device of claim 1, wherein the display panel comprises a display area to display an image and a non-display area adjacent to the display area, and the first area is defined to cross the display area.

10. The display device of claim 1, wherein the first area crosses the display panel in a first direction when viewed in a plan view and is bent with respect to a reference axis defined in the first area and extending in the first direction.

11. A display device, comprising:
    a display panel comprising a first area defined therein and comprising a lower surface and an upper surface opposite the lower surface;
    a first film under the lower surface of the display panel and comprising a film groove defined therein to overlap with the first area;
    a second film on the upper surface of the display panel; and
    an adhesive layer between the lower surface of the display panel and the first film and comprising an adhesive groove defined therein to remove a portion of the adhesive layer overlapping with the first area,
    wherein a first adhesive layer of the adhesive layer overlaps with the first area, and a second adhesive layer of the adhesive layer is adjacent to the first adhesive layer,
    wherein the first adhesive layer has a first thickness, and the second adhesive layer has a second thickness different from the first thickness.

12. The display device of claim 11, wherein the second thickness is greater than the first thickness.

13. The display device of claim 11, wherein the display panel includes a base substrate defining the lower surface of the display panel, a driving layer on the base substrate, an organic light emitting diode on the driving layer, and a sealing layer covering the organic light emitting diode;
    wherein a portion of the base substrate overlapping with the first area comprises carbides.

14. The display device of claim 13, wherein the first adhesive layer contacts the portion of the base substrate overlapping with the first area.

15. The display device of claim 11, wherein an angle between the first adhesive layer and each of an inner surface of the first film defining the film groove and an inner surface of the second adhesive layer defining the adhesive groove is an obtuse angle.

16. The display device of claim 11, further comprising a burr on a lower surface of the first film adjacent to the film groove.

17. The display device of claim 11, wherein the display panel comprises a display area to display an image and a non-display area adjacent to the display area, and the first area is defined in the non-display area.

18. The display device of claim 11, wherein the display panel comprises a display area to display an image and a non-display area adjacent to the display area, and the first area is defined to cross the display area.

19. The display device of claim 11, wherein the first area crosses the display panel in a first direction when viewed in a plan view and is bent with respect to a reference axis defined in the first area and extending in the first direction.

20. The display device of claim 11, wherein the first film comprises polyethylene terephthalate.

* * * * *